United States Patent
Baylor

(10) Patent No.: US 8,694,931 B1
(45) Date of Patent: *Apr. 8, 2014

(54) SYSTEMS AND METHODS FOR SUPER-THREADING OF INTEGRATED CIRCUIT DESIGN PROGRAMS

(75) Inventor: Denis Baylor, Cupertino, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/031,215

(22) Filed: Feb. 20, 2011

Related U.S. Application Data

(62) Division of application No. 11/756,157, filed on May 31, 2007, now Pat. No. 7,913,194.

(60) Provisional application No. 60/810,275, filed on Jun. 2, 2006.

(51) Int. Cl.
*G06F 17/50* (2006.01)

(52) U.S. Cl.
USPC .......................................... 716/100; 716/102

(58) Field of Classification Search
USPC .................... 716/118–125, 138, 100–104
See application file for complete search history.

(56) References Cited

U.S. PATENT DOCUMENTS

| | | | |
|---|---|---|---|
| 5,812,416 A | 9/1998 | Gupte et al. | |
| 5,928,369 A | 7/1999 | Keyser et al. | |
| 6,587,995 B1 | 7/2003 | Duboc et al. | |
| 6,662,358 B1 | 12/2003 | Berry et al. | |
| 6,857,110 B1 | 2/2005 | Rupp et al. | |
| 7,240,303 B1* | 7/2007 | Schubert et al. | 716/106 |
| 7,721,265 B1 | 5/2010 | Xu et al. | |
| 7,913,194 B1* | 3/2011 | Baylor | 716/122 |
| 8,065,640 B1 | 11/2011 | Richter et al. | |
| 2002/0080174 A1 | 6/2002 | Kodosky et al. | |
| 2002/0157080 A1 | 10/2002 | Kato et al. | |
| 2003/0193522 A1* | 10/2003 | Chandhoke | 345/764 |
| 2004/0015798 A1* | 1/2004 | Davidson et al. | 716/5 |
| 2004/0194038 A1* | 9/2004 | Tamai | 716/1 |
| 2005/0071126 A1 | 3/2005 | Groz | |
| 2005/0071814 A1 | 3/2005 | Aguilar et al. | |
| 2005/0268258 A1* | 12/2005 | Decker | 716/4 |
| 2006/0015313 A1* | 1/2006 | Wang et al. | 703/14 |
| 2006/0053396 A1* | 3/2006 | Eng | 716/7 |
| 2006/0150126 A1 | 7/2006 | Kamannavar et al. | |
| 2007/0038416 A1 | 2/2007 | Benayon et al. | |

OTHER PUBLICATIONS

Corno et al.; "RT-level Fault Simulation Techniques based on Simulation Command Scripts"; Dec. 2000; Conference on Design of Circuits and Integrated Systems; 6 pages.

\* cited by examiner

*Primary Examiner* — Binh Tat
(74) *Attorney, Agent, or Firm* — Alford Law Group, Inc.; Tobi C. Clinton

(57) ABSTRACT

In one embodiment of the invention, a method is disclosed including receiving a netlist of an integrated circuit design; executing a first copy of an integrated circuit design program with a first processor associated with a first memory space to independently perform work on a first portion of the integrated circuit design; and executing a second copy of the integrated circuit design program with a second processor associated with a second memory space to independently perform work on a second portion of the integrated circuit design; wherein the second memory space is independent of the first memory space.

9 Claims, 25 Drawing Sheets

FIG. 3-1

```
310 ──── set ::rc_st::bg::job add_unsigned
    312 ─┤ if  {[string compare [get_attribute program_tcl_level /] 6.1.20] }  { return -code error " DB
         └  version mismatch:  db version is 6.1.20, this version is [get_attribute program_tcl_level /] " }
314 ──── set ::rcdb::design [edit_netlist new_design -quiet -name add_unsigned]
    316 ──── pushd $::rcdb::design
318 ──── set_attribute -quiet gb_gdef_type add_unsigned .
    ┌ set_attribute -quiet comp_builder_info {9  {} 0 0 0 2 7 1 ADD_UNS_OP 3 A 16 B 16 Z 16 0 3 GB
320 ─┤ add_unsigned b1 GB add_unsigned b1 GB add_unsigned b1 3 0 {} 0 0 0 2 7 1 15 16 16 0 0  {} 0 0 0
    └ 2 7 1 16 16 16 0 0 {} 0 0 0 2 7 1 16 16 16 0 3 very_fast medium slow 0 2 0 } .
321 ──── set_attribute -quiet        Speed_grade { /hdl_libraries/GB/components/add_unsigned/implementations/very_fast b1 } .
     ┌ set_attribute -quiet st_allow_arch_selection_subdesign true .
     │ set_attribute -quiet st_allow_arch_tuning_subdesign true .
     │ set_attribute -quiet rtlopto_group_info {} .
322 ─┤ set_attribute -quiet force_full_adder false .
     │ set_attribute -quiet first_clock_period_in_ps 0.0 .
     └ set_attribute -quiet generic true .
302A ──── ::rcdb::po {{A 15 0  } {B 15 0  }} {{Z 15 0  }} {}
     ┌ ::rcdb::pi g1 xor 2
     │ ::rcdb::pi g10 nor 2
     │ ::rcdb::pi g100 not 1
     │ ::rcdb::pi g101 nor 2
     │ ::rcdb::pi g102 not 1
     │ ::rcdb::pi g103 nor 2
     │ ::rcdb::pi g104 nand 2
     │ ::rcdb::pi g105 not 1
     │ ::rcdb::pi g106 nor 2
     │ ::rcdb::pi g107 not 1
     │ ::rcdb::pi g108 nor 2
     │ ::rcdb::pi g109 nand 2
     │ ::rcdb::pi g11 nand 2
     │ ::rcdb::pi g110 not 1
     │ ::rcdb::pi g111 nor 2
     │ ::rcdb::pi g112 not 1
     │ ::rcdb::pi g113 nor 2
     │ ::rcdb::pi g114 nand 2
     │ ::rcdb::pi g115 not 1
     │ ::rcdb::pi g116 nor 2
     │ ::rcdb::pi g117 not 1
     │ ::rcdb::pi g118 nor 2
     │ ::rcdb::pi g119 nand 2
     │ ::rcdb::pi g12 nor 2
     │ ::rcdb::pi g120 not 1
     │ ::rcdb::pi g121 nor 2
     │ ::rcdb::pi g122 not 1
     │ ::rcdb::pi g123 nor 2
     │ ::rcdb::pi g124 nand 2
     │ ::rcdb::pi g125 not 1
     │ ::rcdb::pi g126 nor 2
     │ ::rcdb::pi g127 not 1
     │ ::rcdb::pi g128 nor 2
     │ ::rcdb::pi g129 nand 2
     │ ::rcdb::pi g13 nand 2
     │ ::rcdb::pi g130 not 1
     │ ::rcdb::pi g131 nor 2
     │ ::rcdb::pi g132 not 1
     │ ::rcdb::pi g133 nor 2
302B ┤ ::rcdb::pi g134 nand 2
     │ ::rcdb::pi g135 not 1
     │ ::rcdb::pi g136 nor 2
     │ ::rcdb::pi g137 not 1
     │ ::rcdb::pi g138 nor 2
     │ ::rcdb::pi g139 nand 2
     │ ::rcdb::pi g14 nor 2
     │ ::rcdb::pi g140 not 1
     │ ::rcdb::pi g141 nor 2
     │ ::rcdb::pi g142 not 1
     │ ::rcdb::pi g143 nor 2
     │ ::rcdb::pi g144 nand 2
     │ ::rcdb::pi g145 not 1
     │ ::rcdb::pi g146 nor 2
     │ ::rcdb::pi g147 not 1
     │ ::rcdb::pi g148 nor 2
     │ ::rcdb::pi g149 nand 2
     │ ::rcdb::pi g15 nand 2
     │ ::rcdb::pi g150 not 1
     └ ::rcdb::pi g151 nor 2
              ⋮          ⋮
```

FIG. 3-2

```
::rcdb::pi g64 nor 2
::rcdb::pi g65 not 1
::rcdb::pi g66 nor 2
::rcdb::pi g67 nor 2
::rcdb::pi g68 nor 2
::rcdb::pi g69 not 1
::rcdb::pi g7 nand 2
::rcdb::pi g70 nor 2
::rcdb::pi g71 nor 2
::rcdb::pi g72 nor 2
::rcdb::pi g73 not 1
::rcdb::pi g74 nor 2
::rcdb::pi g75 nor 2
::rcdb::pi g76 nor 2
::rcdb::pi g77 not 1
::rcdb::pi g78 nor 2
::rcdb::pi g79 nor 2
::rcdb::pi g8 nor 2
::rcdb::pi g80 nor 2
::rcdb::pi g81 not 1
::rcdb::pi g82 nor 2
::rcdb::pi g83 nor 2
::rcdb::pi g84 nor 2
::rcdb::pi g85 not 1
::rcdb::pi g86 nor 2
::rcdb::pi g87 nor 2
::rcdb::pi g88 nor 2
::rcdb::pi g89 not 1
::rcdb::pi g9 nand 2
::rcdb::pi g90 nor 2
::rcdb::pi g91 nor 2
::rcdb::pi g92 not 1
::rcdb::pi g93 nand 2
::rcdb::pi g94 nand 2
::rcdb::n n_1 {0 g2 in_0 0} {0 g1 in_0 0} {1 . A 15}
::rcdb::n n_10 {0 g23 in_0 0} {0 g22 in_0 0} {1 . A 6}
::rcdb::n n_100 {0 g82 in_0 0} {1 g80 z 0}
::rcdb::n n_101 {0 g82 in_1 0} {1 g81 z 0}
::rcdb::n n_102 {0 g87 in_1 0} {0 g84 in_1 0} {0 g83 in_0 0} {0 g226 in_0 0} {1 g10 z 0}
::rcdb::n n_103 {0 g89 in_0 0} {0 g84 in_0 0} {0 g224 in_1 0} {1 g9 z 0}
::rcdb::n n_104 {0 g86 in_0 0} {1 g84 z 0}
::rcdb::n n_105 {0 g86 in_1 0} {1 g85 z 0}
::rcdb::n n_106 {0 g91 in_1 0} {0 g88 in_1 0} {0 g87 in_0 0} {0 g223 in_0 0} {1 g8 z 0}
::rcdb::n n_107 {0 g94 in_0 0} {0 g88 in_0 0} {0 g221 in_1 0} {1 g7 z 0}
::rcdb::n n_108 {0 g90 in_0 0} {1 g88 z 0}
::rcdb::n n_109 {0 g90 in_1 0} {1 g89 z 0}
::rcdb::n n_11 {0 g25 in_0 0} {0 g24 in_0 0} {1 . A 5}
::rcdb::n n_110 {0 g92 in_0 0} {0 g91 in_0 0} {1 g6 z 0}
::rcdb::n n_111 {0 g93 in_0 0} {0 g222 in_0 0} {0 g218 in_0 0} {0 g157 in_0 0} {1 g266 z 0}
::rcdb::n n_112 {0 g93 in_1 0} {0 g221 in_0 0} {1 g92 z 0}
::rcdb::n n_113 {0 g94 in_1 0} {1 g93 z 0}
::rcdb::n n_115 {0 g107 in_0 0} {1 g46 z 0}
::rcdb::n n_12 {0 g27 in_0 0} {0 g26 in_0 0} {1 . A 4}
::rcdb::n n_120 {0 g109 in_1 0} {0 g105 in_0 0} {1 g47 z 0}
::rcdb::n n_121 {0 g104 in_1 0} {0 g100 in_0 0} {1 g43 z 0}
::rcdb::n n_122 {0 g112 in_0 0} {0 g101 in_0 0} {1 g50 z 0}
::rcdb::n n_123 {0 g101 in_1 0} {1 g100 z 0}
::rcdb::n n_124 {0 g102 in_0 0} {1 g42 z 0}
::rcdb::n n_125 {0 g103 in_0 0} {1 g101 z 0}
::rcdb::n n_126 {0 g103 in_1 0} {1 g102 z 0}
::rcdb::n n_127 {0 g114 in_1 0} {0 g110 in_0 0} {0 g104 in_0 0} {1 g51 z 0}
::rcdb::n n_128 {0 g117 in_0 0} {0 g106 in_0 0} {1 g54 z 0}
::rcdb::n n_129 {0 g106 in_1 0} {1 g105 z 0}
::rcdb::n n_13 {0 g29 in_0 0} {0 g28 in_0 0} {1 . A 3}
::rcdb::n n_130 {0 g108 in_0 0} {1 g106 z 0}
::rcdb::n n_131 {0 g108 in_1 0} {1 g107 z 0}
::rcdb::n n_132 {0 g119 in_1 0} {0 g115 in_0 0} {0 g109 in_0 0} {1 g55 z 0}
::rcdb::n n_133 {0 g122 in_0 0} {0 g111 in_0 0} {1 g58 z 0}
::rcdb::n n_134 {0 g111 in_1 0} {1 g110 z 0}
::rcdb::n n_135 {0 g113 in_0 0} {1 g111 z 0}
::rcdb::n n_136 {0 g113 in_1 0} {1 g112 z 0}
::rcdb::n n_137 {0 g124 in_1 0} {0 g120 in_0 0} {0 g114 in_0 0} {1 g59 z 0}
::rcdb::n n_138 {0 g127 in_0 0} {0 g116 in_0 0} {1 g62 z 0}
::rcdb::n n_139 {0 g116 in_1 0} {1 g115 z 0}
::rcdb::n n_14 {0 g31 in_0 0} {0 g30 in_0 0} {1 . A 2}
::rcdb::n n_140 {0 g118 in_0 0} {1 g116 z 0}
```

302B

302C

```
::rcdb::n n_287 {0 g255 in_1 0} {1 g254 z 0}
::rcdb::n n_288 {0 g257 in_0 0} {1 g256 z 0}
::rcdb::n n_289 {0 g258 in_0 0} {1 g211 z 0}
::rcdb::n n_29 {0 g29 in_1 0} {0 g28 in_1 0} {1 . B 3}
::rcdb::n n_290 {0 g258 in_1 0} {1 g257 z 0}
::rcdb::n n_291 {0 g260 in_0 0} {1 g259 z 0}
::rcdb::n n_292 {0 g261 in_0 0} {1 g209 z 0}
::rcdb::n n_293 {0 g261 in_1 0} {1 g260 z 0}
::rcdb::n n_294 {0 g263 in_0 0} {1 g262 z 0}
::rcdb::n n_295 {0 g264 in_0 0} {1 g207 z 0}
::rcdb::n n_296 {0 g264 in_1 0} {1 g263 z 0}
::rcdb::n n_3 {0 g9 in_0 0} {0 g8 in_0 0} {1 . A 13}
::rcdb::n n_30 {0 g31 in_1 0} {0 g30 in_1 0} {1 . B 2}
::rcdb::n n_300 {0 g50 in_1 0} {1 g49 z 0}
::rcdb::n n_301 {0 g46 in_1 0} {1 g45 z 0}
::rcdb::n n_302 {0 g41 in_0 0} {0 g260 in_1 0} {1 g33 z 0}
::rcdb::n n_303 {0 g42 in_1 0} {1 g41 z 0}
::rcdb::n n_304 {0 g263 in_1 0} {1 g35 z 0}
::rcdb::n n_305 {0 g262 in_0 0} {1 g34 z 0}
::rcdb::n n_31 {0 g33 in_1 0} {0 g32 in_1 0} {1 . B 1}
::rcdb::n n_32 {0 g35 in_1 0} {0 g34 in_1 0} {1 . B 0}
::rcdb::n n_33 {0 . Z 15} {1 g1 z 0}
::rcdb::n n_34 {0 . Z 14} {1 g222 z 0}
::rcdb::n n_35 {0 . Z 13} {1 g225 z 0}
::rcdb::n n_36 {0 . Z 12} {1 g228 z 0}
::rcdb::n n_37 {0 . Z 11} {1 g231 z 0}
::rcdb::n n_38 {0 . Z 10} {1 g234 z 0}
::rcdb::n n_39 {0 . Z 9} {1 g237 z 0}
::rcdb::n n_4 {0 g11 in_0 0} {0 g10 in_0 0} {1 . A 12}
::rcdb::n n_40 {0 . Z 8} {1 g240 z 0}
::rcdb::n n_41 {0 . Z 7} {1 g243 z 0}
::rcdb::n n_42 {0 . Z 6} {1 g246 z 0}
::rcdb::n n_43 {0 . Z 5} {1 g249 z 0}
::rcdb::n n_44 {0 . Z 4} {1 g252 z 0}
::rcdb::n n_45 {0 . Z 3} {1 g255 z 0}
::rcdb::n n_46 {0 . Z 2} {1 g258 z 0}
::rcdb::n n_47 {0 . Z 1} {1 g261 z 0}
::rcdb::n n_48 {0 . Z 0} {1 g264 z 0}
::rcdb::n n_5 {0 g13 in_0 0} {0 g12 in_0 0} {1 . A 11}
::rcdb::n n_50 {0 g51 in_1 0} {0 g48 in_1 0} {0 g47 in_0 0} {0 g253 in_0 0} {1 g28 z 0}
::rcdb::n n_51 {0 g266 in_0 0} {0 g201 in_1 0} {1 g2 z 0}
::rcdb::n n_59 {0 g43 in_1 0} {0 g40 in_1 0} {0 g259 in_0 0} {1 g32 z 0}
::rcdb::n n_6 {0 g15 in_0 0} {0 g14 in_0 0} {1 . A 10}
::rcdb::n n_60 {0 g45 in_1 0} {0 g40 in_0 0} {0 g257 in_1 0} {1 g31 z 0}
::rcdb::n n_61 {0 g42 in_0 0} {1 g40 z 0}
::rcdb::n n_63 {0 g47 in_1 0} {0 g44 in_1 0} {0 g43 in_0 0} {0 g256 in_0 0} {1 g30 z 0}
::rcdb::n n_64 {0 g49 in_0 0} {0 g44 in_0 0} {0 g254 in_1 0} {1 g29 z 0}
::rcdb::n n_65 {0 g46 in_0 0} {1 g44 z 0}
::rcdb::n n_67 {0 g53 in_0 0} {0 g48 in_0 0} {0 g251 in_1 0} {1 g27 z 0}
::rcdb::n n_68 {0 g50 in_0 0} {1 g48 z 0}
::rcdb::n n_7 {0 g17 in_0 0} {0 g16 in_0 0} {1 . A 9}
::rcdb::n n_70 {0 g55 in_1 0} {0 g52 in_1 0} {0 g51 in_0 0} {0 g250 in_0 0} {1 g26 z 0}
::rcdb::n n_71 {0 g57 in_0 0} {0 g52 in_0 0} {0 g248 in_1 0} {1 g25 z 0}
::rcdb::n n_72 {0 g54 in_0 0} {1 g52 z 0}
::rcdb::n n_73 {0 g54 in_1 0} {1 g53 z 0}
::rcdb::n n_74 {0 g59 in_1 0} {0 g56 in_1 0} {0 g55 in_0 0} {0 g247 in_0 0} {1 g24 z 0}
::rcdb::n n_75 {0 g61 in_0 0} {0 g56 in_0 0} {0 g245 in_1 0} {1 g23 z 0}
::rcdb::n n_76 {0 g58 in_0 0} {1 g56 z 0}
::rcdb::n n_77 {0 g58 in_1 0} {1 g57 z 0}
::rcdb::n n_78 {0 g63 in_1 0} {0 g60 in_1 0} {0 g59 in_0 0} {0 g244 in_0 0} {1 g22 z 0}
::rcdb::n n_79 {0 g65 in_0 0} {0 g60 in_0 0} {0 g242 in_1 0} {1 g21 z 0}
::rcdb::n n_8 {0 g19 in_0 0} {0 g18 in_0 0} {1 . A 8}
::rcdb::n n_80 {0 g62 in_0 0} {1 g60 z 0}
::rcdb::n n_81 {0 g62 in_1 0} {1 g61 z 0}
::rcdb::n n_82 {0 g67 in_1 0} {0 g64 in_1 0} {0 g63 in_0 0} {0 g241 in_0 0} {1 g20 z 0}
::rcdb::n n_83 {0 g69 in_0 0} {0 g64 in_0 0} {0 g239 in_1 0} {1 g19 z 0}
::rcdb::n n_84 {0 g66 in_0 0} {1 g64 z 0}
::rcdb::n n_85 {0 g66 in_1 0} {1 g65 z 0}
::rcdb::n n_86 {0 g71 in_1 0} {0 g68 in_1 0} {0 g67 in_0 0} {0 g238 in_0 0} {1 g18 z 0}
::rcdb::n n_87 {0 g73 in_0 0} {0 g68 in_0 0} {0 g236 in_1 0} {1 g17 z 0}
::rcdb::n n_88 {0 g70 in_0 0} {1 g68 z 0}
::rcdb::n n_89 {0 g70 in_1 0} {1 g69 z 0}
::rcdb::n n_9 {0 g21 in_0 0} {0 g20 in_0 0} {1 . A 7}
::rcdb::n n_90 {0 g75 in_1 0} {0 g72 in_1 0} {0 g71 in_0 0} {0 g235 in_0 0} {1 g16 z 0}
::rcdb::n n_91 {0 g77 in_0 0} {0 g72 in_0 0} {0 g233 in_1 0} {1 g15 z 0}
::rcdb::n n_92 {0 g74 in_0 0} {1 g72 z 0}
```

```
      ::rcdb::n_n_93 {0 g74 in_1 0} {1 g73 z 0}
      ::rcdb::n_n_94 {0 g79 in_1 0} {0 g76 in_1 0} {0 g75 in_0 0} {0 g232 in_0 0} {1 g14 z 0}
302C  ::rcdb::n_n_95 {0 g81 in_0 0} {0 g76 in_0 0} {0 g230 in_1 0} {1 g13 z 0}
      ::rcdb::n_n_96 {0 g78 in_0 0} {1 g76 z 0}
      ::rcdb::n_n_97 {0 g78 in_1 0} {1 g77 z 0}
      ::rcdb::n_n_98 {0 g83 in_1 0} {0 g80 in_1 0} {0 g79 in_0 0} {0 g229 in_0 0} {1 g12 z 0}
302D  ::rcdb::n_n_99 {0 g85 in_0 0} {0 g80 in_0 0} {0 g227 in_1 0} {1 g11 z 0}
      ::rcdb::de {267 306 1 1}
      ::rcdb::ne 1
330 ——popd
      ::rc_st::bg::map_set_active_design -wlm /libraries/tutorial/wireload_models/AL_MEDIUM -pwlm
332   /libraries/tutorial/wireload_models/AL_MEDIUM -ideal_async_loads 1 add_10_15 {medium enclosed 0 7
      20 100 0 110 20 250 1000 150 32 0 200 500 90 100 110 110 100 100 105 1 2147483647 2147483647
334   2147483647 1 0 1 0 0 0 1 1 0 1 0 0 1 0 0 1 1 0 0 0 0 0 {1 /libraries/library_domains/_default_
      13704 102780 47964 13704 752 6852 343 6852 1884 3426 0 3750 1000000 3426 209 37}
      eval pushd {$::rcdb::design}
336 ——set_attribute -quiet dft_scan_map_mode tdrc_pass .
338 ——popd
340   mv -flexible $::rcdb::design {add_unsigned}
      ::rc_st::bg::map_clock {0 clock1 domain_1 0 1 0 1 1 2 0 X 0 0 0 0 X X X X 0 0 0 0 0 0 0 0 0 0 0 0 0
      0 0 0 0 0 0};
      ::rc_st::bg::map_sa 2 {0 0 clock1 1 1}
      ::rc_st::bg::map_sa 4 {0 0 clock1 0 1}
306A  ::rc_st::bg::map_input_arrs {{1 . A 0} 0 1 1 {15 {0 0 0 0} {} {0 0 0 0} {} {0 0 0 0} {} {0 0 0 0} {
      } {0 0 0 0} {} {0 0 0 0} {} {0 0 0 0} {} {0 0 0 0} {} {0 0 0 0} {} {0 0 0 0} {} {0 0 0 0} {} {0 0
      0} {} {0 0 0 0} {} {0 0 0 0} {} {0 0 0 0} {}; {{1 2 0}}}
      ::rc_st::bg::map_input_arrs {{1 . A 1} 0 1 1 {15 {0 0 0 0} {} {0 0 0 0} {} {0 0 0 0} {} {0 0 0 0} {
      ...
      ::rc_st::bg::map_input_arrs {{1 . A 9} 0 1 1 {15 {0 0 0 0} {} {0 0 0 0} {} {0 0 0 0} {} {0 0 0 0} {
      } {0 0 0 0} {} {0 0 0 0} {} {0 0 0 0} {} {0 0 0 0} {} {0 0 0 0} {} {0 0 0 0} {} {0 0 0 0} {} {0 0
      0} {} {0 0 0 0} {} {0 0 0 0} {} {0 0 0 0} {}; {{1 2 0}}}
      ::rc_st::bg::map_input_arrs {{1 . A 10} 0 1 1 {15 {0 0 0 0} {} {0 0 0 0} {} {0 0 0 0} {} {0 0 0 0}
      {} {0 0 0 0} {} {0 0 0 0} {} {0 0 0 0} {} {0 0 0 0} {} {0 0 0 0} {} {0 0 0 0} {} {0 0 0 0} {} {0 0
      0 0} {} {0 0 0 0} {} {0 0 0 0} {} {0 0 0 0} {}; {{1 2 0}}}
306B  ::rc_st::bg::map_input_arrs {{1 . A 11} 0 1 1 {15 {0 0 0 0} {} {0 0 0 0} {} {0 0 0 0} {} {0 0 0 0}
      ...
      ::rc_st::bg::map_input_arrs {{1 . B 0} 0 1 1 {15 {0 0 0 0} {} {0 0 0 0} {} {0 0 0 0} {} {0 0 0 0} {
      } {0 0 0 0} {} {0 0 0 0} {} {0 0 0 0} {} {0 0 0 0} {} {0 0 0 0} {} {0 0 0 0} {} {0 0 0 0} {} {0 0
      0} {} {0 0 0 0} {} {0 0 0 0} {} {0 0 0 0} {}; {{1 2 0}}}
      ::rc_st::bg::map_input_arrs {{1 . B 1} 0 1 1 {15 {0 0 0 0} {} {0 0 0 0} {} {0 0 0 0} {} {0 0 0 0} {
      } {0 0 0 0} {} {0 0 0 0} {} {0 0 0 0} {} {0 0 0 0} {} {0 0 0 0} {} {0 0 0 0} {} {0 0 0 0} {} {0 0
      0} {} {0 0 0 0} {} {0 0 0 0} {} {0 0 0 0} {}; {{1 2 0}}}
```

FIG. 3-5

```
::rc_st::bg::map_input_arrs {{1 . B 2} 0 {} 1 {15 {0 0 0 0} {} {0 0 0 0} {} {0 0 0 0} {} {0 0 0 0} {} {0
0 0 0} {} {0 0 0 0} {} {0 0 0 0} {} {0 0 0 0} {} {0 0 0 0} {} {0 0 0 0} {} {0 0 0 0} {} {0 0 0 0} {} {0
0 0 0} {} {0 0 0 0} {} {0 0 0 0} {}} {{1 2 0 0}}}
::rc_st::bg::map_input_arrs {{1 . B 3} 0 {} 1 {15 {0 0 0 0} {} {0 0 0 0} {} {0 0 0 0} {} {0 0 0 0} {} {0
0 0 0} {} {0 0 0 0} {} {0 0 0 0} {} {0 0 0 0} {} {0 0 0 0} {} {0 0 0 0} {} {0 0 0 0} {} {0 0 0 0} {} {0
0 0 0} {} {0 0 0 0} {} {0 0 0 0} {}} {{1 2 0 0}}}
::rc_st::bg::map_input_arrs {{1 . B 4} 0 {} 1 {15 {0 0 0 0} {} {0 0 0 0} {} {0 0 0 0} {} {0 0 0 0} {} {0
0 0 0} {} {0 0 0 0} {} {0 0 0 0} {} {0 0 0 0} {} {0 0 0 0} {} {0 0 0 0} {} {0 0 0 0} {} {0 0 0 0} {} {0
0 0 0} {} {0 0 0 0} {} {0 0 0 0} {}} {{1 2 0 0}}}
::rc_st::bg::map_input_arrs {{1 . B 5} 0 {} 1 {15 {0 0 0 0} {} {0 0 0 0} {} {0 0 0 0} {} {0 0 0 0} {} {0
0 0 0} {} {0 0 0 0} {} {0 0 0 0} {} {0 0 0 0} {} {0 0 0 0} {} {0 0 0 0} {} {0 0 0 0} {} {0 0 0 0} {} {0
0 0 0} {} {0 0 0 0} {} {0 0 0 0} {}} {{1 2 0 0}}}
::rc_st::bg::map_input_arrs {{1 . B 6} 0 {} 1 {15 {0 0 0 0} {} {0 0 0 0} {} {0 0 0 0} {} {0 0 0 0} {} {0
0 0 0} {} {0 0 0 0} {} {0 0 0 0} {} {0 0 0 0} {} {0 0 0 0} {} {0 0 0 0} {} {0 0 0 0} {} {0 0 0 0} {} {0
0 0 0} {} {0 0 0 0} {} {0 0 0 0} {}} {{1 2 0 0}}}
::rc_st::bg::map_input_arrs {{1 . B 7} 0 {} 1 {15 {0 0 0 0} {} {0 0 0 0} {} {0 0 0 0} {} {0 0 0 0} {} {0
0 0 0} {} {0 0 0 0} {} {0 0 0 0} {} {0 0 0 0} {} {0 0 0 0} {} {0 0 0 0} {} {0 0 0 0} {} {0 0 0 0} {} {0
0 0 0} {} {0 0 0 0} {} {0 0 0 0} {}} {{1 2 0 0}}}
::rc_st::bg::map_input_arrs {{1 . B 8} 0 {} 1 {15 {0 0 0 0} {} {0 0 0 0} {} {0 0 0 0} {} {0 0 0 0} {} {0
0 0 0} {} {0 0 0 0} {} {0 0 0 0} {} {0 0 0 0} {} {0 0 0 0} {} {0 0 0 0} {} {0 0 0 0} {} {0 0 0 0} {} {0
0 0 0} {} {0 0 0 0} {} {0 0 0 0} {}} {{1 2 0 0}}}
::rc_st::bg::map_input_arrs {{1 . B 9} 0 {} 1 {15 {0 0 0 0} {} {0 0 0 0} {} {0 0 0 0} {} {0 0 0 0} {} {0
0 0 0} {} {0 0 0 0} {} {0 0 0 0} {} {0 0 0 0} {} {0 0 0 0} {} {0 0 0 0} {} {0 0 0 0} {} {0 0 0 0} {} {0
0 0 0} {} {0 0 0 0} {} {0 0 0 0} {}} {{1 2 0 0}}}
::rc_st::bg::map_input_arrs {{1 . B 10} 0 {} 1 {15 {0 0 0 0} {} {0 0 0 0} {} {0 0 0 0} {} {0 0 0 0} {} {
0 0 0 0} {} {0 0 0 0} {} {0 0 0 0} {} {0 0 0 0} {} {0 0 0 0} {} {0 0 0 0} {} {0 0 0 0} {} {0 0 0 0} {} {
0 0 0 0} {} {0 0 0 0} {} {0 0 0 0} {}} {{1 2 0 0}}}
::rc_st::bg::map_input_arrs {{1 . B 11} 0 {} 1 {15 {0 0 0 0} {} {0 0 0 0} {} {0 0 0 0} {} {0 0 0 0} {} {
0 0 0 0} {} {0 0 0 0} {} {0 0 0 0} {} {0 0 0 0} {} {0 0 0 0} {} {0 0 0 0} {} {0 0 0 0} {} {0 0 0 0} {} {
0 0 0 0} {} {0 0 0 0} {} {0 0 0 0} {}} {{1 2 0 0}}}
::rc_st::bg::map_input_arrs {{1 . B 12} 0 {} 1 {15 {0 0 0 0} {} {0 0 0 0} {} {0 0 0 0} {} {0 0 0 0} {} {
0 0 0 0} {} {0 0 0 0} {} {0 0 0 0} {} {0 0 0 0} {} {0 0 0 0} {} {0 0 0 0} {} {0 0 0 0} {} {0 0 0 0} {} {
0 0 0 0} {} {0 0 0 0} {} {0 0 0 0} {}} {{1 2 0 0}}}
::rc_st::bg::map_input_arrs {{1 . B 13} 0 {} 1 {15 {0 0 0 0} {} {0 0 0 0} {} {0 0 0 0} {} {0 0 0 0} {} {
0 0 0 0} {} {0 0 0 0} {} {0 0 0 0} {} {0 0 0 0} {} {0 0 0 0} {} {0 0 0 0} {} {0 0 0 0} {} {0 0 0 0} {} {
0 0 0 0} {} {0 0 0 0} {} {0 0 0 0} {}} {{1 2 0 0}}}
::rc_st::bg::map_input_arrs {{1 . B 14} 0 {} 1 {15 {0 0 0 0} {} {0 0 0 0} {} {0 0 0 0} {} {0 0 0 0} {} {
0 0 0 0} {} {0 0 0 0} {} {0 0 0 0} {} {0 0 0 0} {} {0 0 0 0} {} {0 0 0 0} {} {0 0 0 0} {} {0 0 0 0} {} {
0 0 0 0} {} {0 0 0 0} {} {0 0 0 0} {}} {{1 2 0 0}}}
::rc_st::bg::map_input_arrs {{1 . B 15} 0 {} 1 {15 {0 0 0 0} {} {0 0 0 0} {} {0 0 0 0} {} {0 0 0 0} {} {
0 0 0 0} {} {0 0 0 0} {} {0 0 0 0} {} {0 0 0 0} {} {0 0 0 0} {} {0 0 0 0} {} {0 0 0 0} {} {0 0 0 0} {} {
0 0 0 0} {} {0 0 0 0} {} {0 0 0 0} {}} {{1 2 0 0}}}
::rc_st::bg::map_condense_output_reqs {{C . Z 0} 1 {{1 4 1000 1000}}}
::rc_st::bg::map_condense_output_reqs {{C . Z 1} 1 {{1 4 1000 1000}}}
::rc_st::bg::map_condense_output_reqs {{C . Z 2} 1 {{1 4 1000 1000}}}
::rc_st::bg::map_condense_output_reqs {{C . Z 3} 1 {{1 4 1000 1000}}}
::rc_st::bg::map_condense_output_reqs {{C . Z 4} 1 {{1 4 1000 1000}}}
::rc_st::bg::map_condense_output_reqs {{C . Z 5} 1 {{1 4 1000 1000}}}
::rc_st::bg::map_condense_output_reqs {{C . Z 6} 1 {{1 4 1000 1000}}}
::rc_st::bg::map_condense_output_reqs {{C . Z 7} 1 {{1 4 1000 1000}}}
::rc_st::bg::map_condense_output_reqs {{C . Z 8} 1 {{1 4 1000 1000}}}
::rc_st::bg::map_condense_output_reqs {{C . Z 9} 1 {{1 4 1000 1000}}}
::rc_st::bg::map_condense_output_reqs {{C . Z 10} 1 {{1 4 1000 1000}}}
::rc_st::bg::map_condense_output_reqs {{C . Z 11} 1 {{1 4 1000 1000}}}
::rc_st::bg::map_condense_output_reqs {{C . Z 12} 1 {{1 4 1000 1000}}}
::rc_st::bg::map_condense_output_reqs {{C . Z 13} 1 {{1 4 1000 1000}}}
::rc_st::bg::map_condense_output_reqs {{C . Z 14} 1 {{1 4 1000 1000}}}
::rc_st::bg::map_condense_output_reqs {{C . Z 15} 1 {{1 4 1000 1000}}}
::rc_st::bg::map_bg_load_info {0 . Z 0} {1 /libraries/tutorial/wireload_models/AL_MEDIUM 200 1 1 0 1 0 0
0 200 0 0 1000 -1111111111 X} 0
::rc_st::bg::map_bg_load_info {0 . Z 1} {1 /libraries/tutorial/wireload_models/AL_MEDIUM 200 1 1 0 1 0 0
0 200 0 0 1000 -1111111111 X} 0
::rc_st::bg::map_bg_load_info {0 . Z 2} {1 /libraries/tutorial/wireload_models/AL_MEDIUM 200 1 1 0 1 0 0
0 200 0 0 1000 -1111111111 X} 0
::rc_st::bg::map_bg_load_info {0 . Z 3} {1 /libraries/tutorial/wireload_models/AL_MEDIUM 200 1 1 0 1 0 0
0 200 0 0 1000 -1111111111 X} 0
::rc_st::bg::map_bg_load_info {0 . Z 4} {1 /libraries/tutorial/wireload_models/AL_MEDIUM 200 1 1 0 1 0 0
0 200 0 0 1000 -1111111111 X} 0
::rc_st::bg::map_bg_load_info {0 . Z 5} {1 /libraries/tutorial/wireload_models/AL_MEDIUM 200 1 1 0 1 0 0
0 200 0 0 1000 -1111111111 X} 0
::rc_st::bg::map_bg_load_info {0 . Z 6} {1 /libraries/tutorial/wireload_models/AL_MEDIUM 200 1 1 0 1 0 0
0 200 0 0 1000 -1111111111 X} 0
::rc_st::bg::map_bg_load_info {0 . Z 7} {1 /libraries/tutorial/wireload_models/AL_MEDIUM 200 1 1 0 1 0 0
0 200 0 0 1000 -1111111111 X} 0
::rc_st::bg::map_bg_load_info {0 . Z 8} {1 /libraries/tutorial/wireload_models/AL_MEDIUM 200 1 1 0 1 0 0
0 200 0 0 1000 -1111111111 X} 0
```

```
::rc_st::bg::map_bg_load_info {0 . Z 9} {1 /libraries/tutorial/wireload_models/AL_MEDIUM 200 1 1
0 1 0 0 0 200 0 0 1000 -11111111 X} 0
::rc_st::bg::map_bg_load_info {0 . Z 10} {1 /libraries/tutorial/wireload_models/AL_MEDIUM 200 1 1
0 1 0 0 0 200 0 0 1000 -11111111 X} 0
::rc_st::bg::map_bg_load_info {0 . Z 11} {1 /libraries/tutorial/wireload_models/AL_MEDIUM 200 1 1
0 1 0 0 0 200 0 0 1000 -11111111 X} 0
::rc_st::bg::map_bg_load_info {0 . Z 12} {1 /libraries/tutorial/wireload_models/AL_MEDIUM 200 1 1
0 1 0 0 0 200 0 0 1000 -11111111 X} 0
::rc_st::bg::map_bg_load_info {0 . Z 13} {1 /libraries/tutorial/wireload_models/AL_MEDIUM 200 1 1
0 1 0 0 0 200 0 0 1000 -11111111 X} 0
::rc_st::bg::map_bg_load_info {0 . Z 14} {1 /libraries/tutorial/wireload_models/AL_MEDIUM 200 1 1
0 1 0 0 0 200 0 0 1000 -11111111 X} 0
::rc_st::bg::map_bg_load_info {0 . Z 15} {1 /libraries/tutorial/wireload_models/AL_MEDIUM 200 1 1
0 1 0 0 0 200 0 0 1000 -11111111 X} 0
eval ::rc_st::bg::map_remote_condense [$::rcdb::design]
```

390

```
                        1000 define the technology library
        1001 ——— set_attr library tutorial.lib / read in the RTL
        1002 ——— read_hdl alu.v; elaborate add a timing constraint (10000.0ps clock waveform)
        1003 ——— define_clock -p 10000 -n clock [clock_ports]

# define the machine list for super-threading
        1004 ——— set_attribute super_thread_servers {rcl101 rcl102 rcl103} / turn on work script logging, write it to a directory called 'debug'
        1005 ——— set st_log_dir debug map and optimize the design
        1006 ——— techmap write out the resulting mapped netlist
        1007 ——— write -mapped > alu_m.v
```

1101 ——set ::rc_st::bg::job selector
1112 ——⎧ if {[string compare [get_attribute program_tcl_level /] 6.1.24]} { return
       ⎨  -code error " DB version mismatch:  db version is 6.1.24, this version is
       ⎩  [get_attribute program_tcl_level /] " }
1103 ——set ::rcdb::design [edit_netlist new_design -quiet -name __st_mux_opto]
1104 ——pushd $::rcdb::design
1102A1——::rcdb::po {in1 in2 in3 {ctl 1 0}} out {}
1102B1——⎧ ::rcdb::pi g4 not 1
        ⎩ ::rcdb::pi g5 not 1
1120 ——⎧ pushd [::rcdb::ui mux_6_22 mux]
        ⎨ pushd [get_attribute subdesign .]
        ⎩ set_attribute -quiet gb_gdef_type mux .
1130A——popd
1102A2——::rcdb::po {{ctl 1 0} in_0 in_1} z {}
1123 ——::rcdb::de {1 1 1 1}
1130B——popd
1102B2——::rcdb::ui mux_6_38 mux
1102C——⎧ ::rcdb::n ctl_13 {0 mux_6_22 ctl 1} {0 g5 in_0 0} {1 . ctl 1}
        ⎪ ::rcdb::n ctl_7 {0 mux_6_38 ctl 1} {0 g4 in_0 0} {1 . ctl 0}
        ⎪ ::rcdb::n in_10 {0 mux_6_22 in_1 0} {1 . in1 0}
        ⎪ ::rcdb::n in_3 {0 mux_6_38 in_1 0} {1 . in2 0}
        ⎨ ::rcdb::n in_4 {0 mux_6_38 in_0 0} {1 . in3 0}
        ⎪ ::rcdb::n n_11 {0 mux_6_22 ctl 0} {1 g5 z 0}
        ⎪ ::rcdb::n n_14 {0 mux_6_22 in_0 0} {1 mux_6_38 z 0}
        ⎪ ::rcdb::n n_5 {0 mux_6_38 ctl 0} {1 g4 z 0}
        ⎩ ::rcdb::n out_15 {0 . out 0} {1 mux_6_22 z 0}
1158 ——::rcdb::de {6 16 2 1}
1160 ——::rcdb::ne 3
1130C——popd
1140 ——pushd $::rcdb::design
1130D——popd
1164 ——::rc_st::bg::mux_opto_directives {{}}
1165 ——::rc_st::bg::remote_mux_opto .
```

1201 ─── if {[string compare [get_attribute program_tcl_level /] 6.1.24]} { return
        -code error " DB version mismatch:  db version is 6.1.24, this version is
        [get_attribute program_tcl_level /] " }
1203 ─── set ::rcdb::design [edit_netlist new_design -quiet -name __st_mux_opto_1]
1204 ─── pushd $::rcdb::design
1202A1 ── ::rcdb::po {in1 in2 in3 {ctl 1 0}} out {}
         ┌ pushd [::rcdb::hi mux6 mux]
1220 ─── ┤ pushd [get_attribute subdesign .]
         └ set_attribute -quiet gb_gdef_type mux .
1230A ── popd
1202A2 ── ::rcdb::po {{ctl 2 0} in_0 in_1 in_2} z {}
1223 ─── ::rcdb::de {2 8 1 1}
1230B ── popd
         ┌ ::rcdb::pi g10 nor 2
1202B ──┤ ::rcdb::pi g15 nor 2
         ┌ ::rcdb::n ctl_13 {0 mux6 ctl 2} {0 g10 in_1 0} {0 g15 in_0 0} {1 . ctl 1}
         │ ::rcdb::n ctl_7 {0 g10 in_0 0} {1 . ctl 0}
         │ ::rcdb::n in_10 {0 mux6 in_2 0} {1 . in1 0}
         │ ::rcdb::n in_3 {0 mux6 in_1 0} {1 . in2 0}
1202C ──┤ ::rcdb::n in_4 {0 mux6 in_0 0} {1 . in3 0}
         │ ::rcdb::n n_18 {0 . out 0} {1 mux6 z 0}
         │ ::rcdb::n n_16 {0 mux6 ctl 0} {0 g15 in_1 0} {1 g10 z 0}
         └ ::rcdb::n n_28 {0 mux6 ctl 1} {1 g15 z 0}
1258 ─── ::rcdb::de {16 29 2 1}
1260 ─── ::rcdb::ne 6
1230C ── popd
1265 ─── ::rc_st::fg::receive_mux_opto selector
```

*FIG. 12*

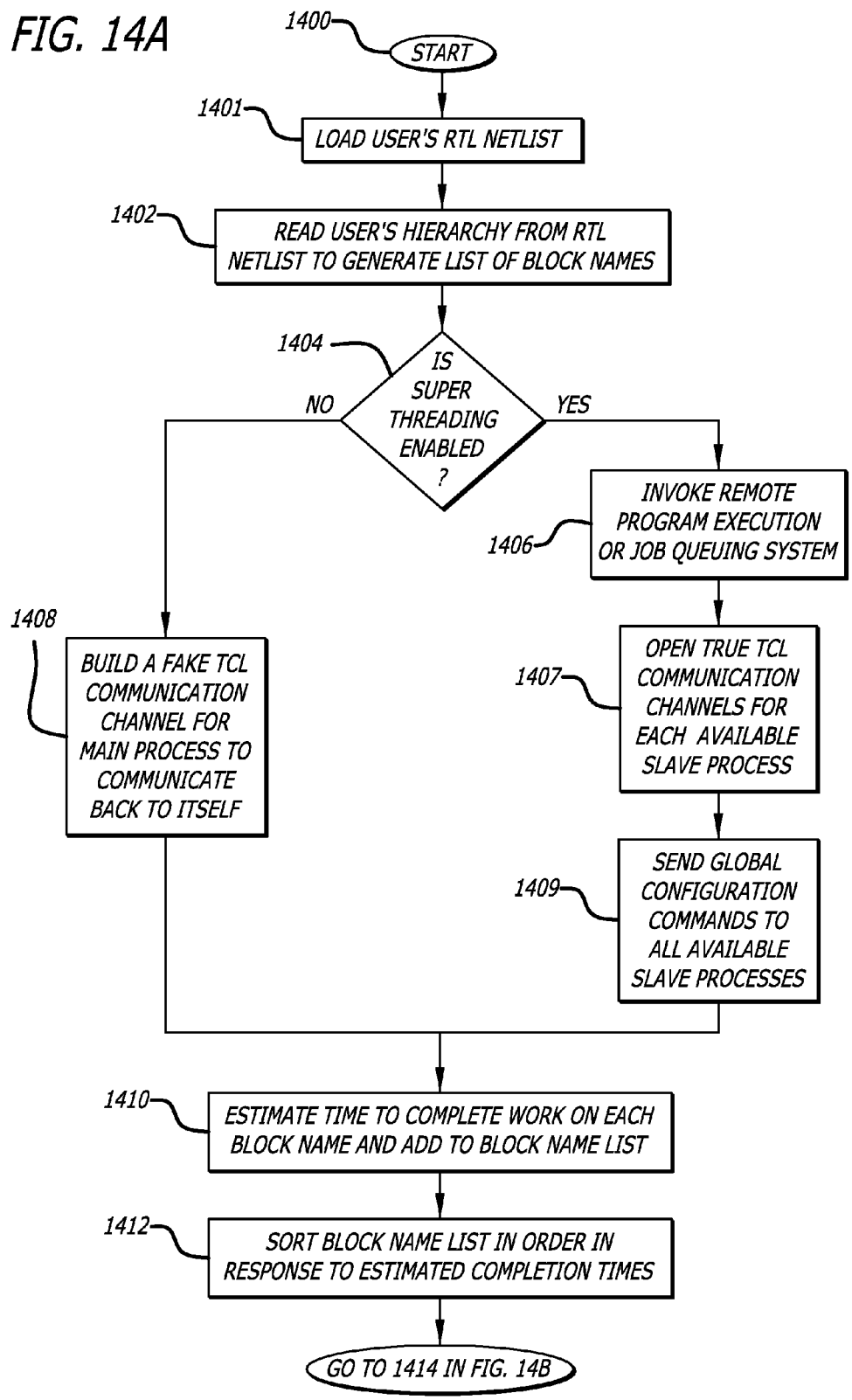

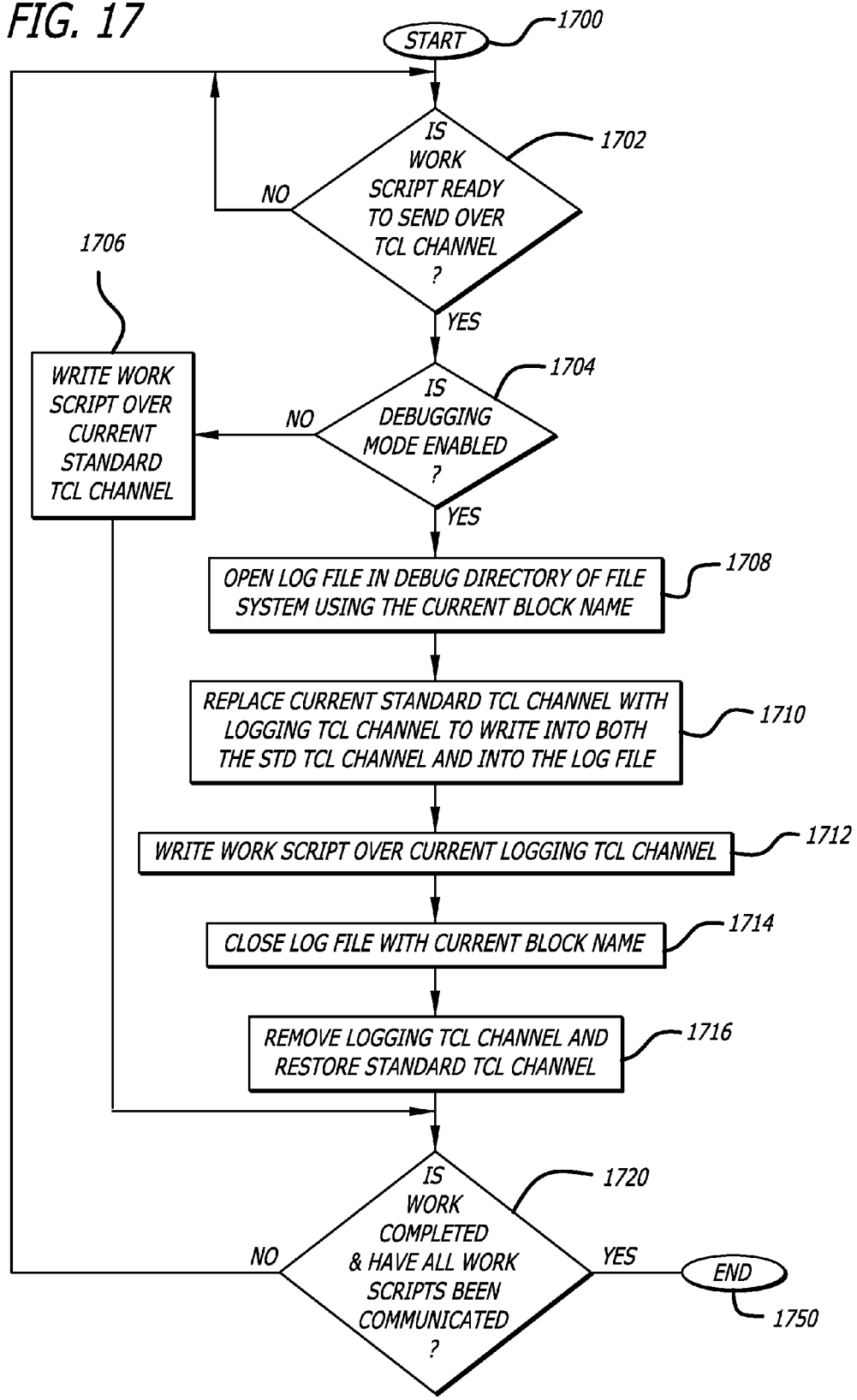

US 8,694,931 B1

SYSTEMS AND METHODS FOR SUPER-THREADING OF INTEGRATED CIRCUIT DESIGN PROGRAMS

CROSS-REFERENCE TO RELATED APPLICATIONS

This non-provisional United States (U.S.) patent application is a divisional and claims the benefit of U.S. patent application Ser. No. 11/756,157 entitled SYSTEMS AND METHODS FOR SUPER-THREADING filed on May 31, 2007 by Dennis Baylor, now allowed, which is incorporated herein by reference. U.S. patent application Ser. No. 11/756,157 claims the benefit of U.S. Provisional Patent Application No. 60/810,275 filed on Jun. 2, 2006 by inventors Richter, et al., entitled REDUCED TEST CASE GENERATION.

FIELD

The embodiments of the invention relate generally to multi-processor computer systems and parallel processing. More particularly, the embodiments of the invention relate to coincidentally executing multiple copies of an integrated circuit design software program to spread out work to be performed on an integrated circuit design.

BACKGROUND

Time to market for electronic devices, such as an integrated circuit, is often key to meet market demands and achieve significant sales volumes. If the time when market demand is high is missed, there may be little profit in manufacturing and selling an integrated circuit. One factor that effects the time to market an integrated circuit is the time it takes to design it. If the design time for an integrated circuit can be compressed, a time to market window may be more easily met.

Thus, it is desirable to reduce the time it takes to perform work on an integrated circuit design to reduce its overall design time.

BRIEF DESCRIPTIONS OF THE DRAWINGS

FIG. 3-1 through 3-6 illustrate a sequence of commands written in TCL format that are communicated over a TCL communication channel as a typical work script to operate on a block of the integrated circuit design.

FIG. 4 is a flow chart illustrating a method of generating a debug work script file at a fault in the IC design program.

FIG. 5 is a block diagram illustrating the information flow between a customer/user and a software developer/programmer to debug IC design software.

FIG. 6 is a flow chart illustrating a method of debugging a fault in an IC design program by a software developer/programmer using the debug work script file reducing the information needed from a customer/user.

FIG. 10 is an exemplary start-up script.

FIG. 11 is an exemplary pre-work script.

FIG. 12 is an exemplary post-work script.

FIGS. 14A-14B is a flow chart of a method of a master process to support super-threading.

FIG. 17 is a flow chart of a method of debug logging.

DETAILED DESCRIPTION

Figure 1A:
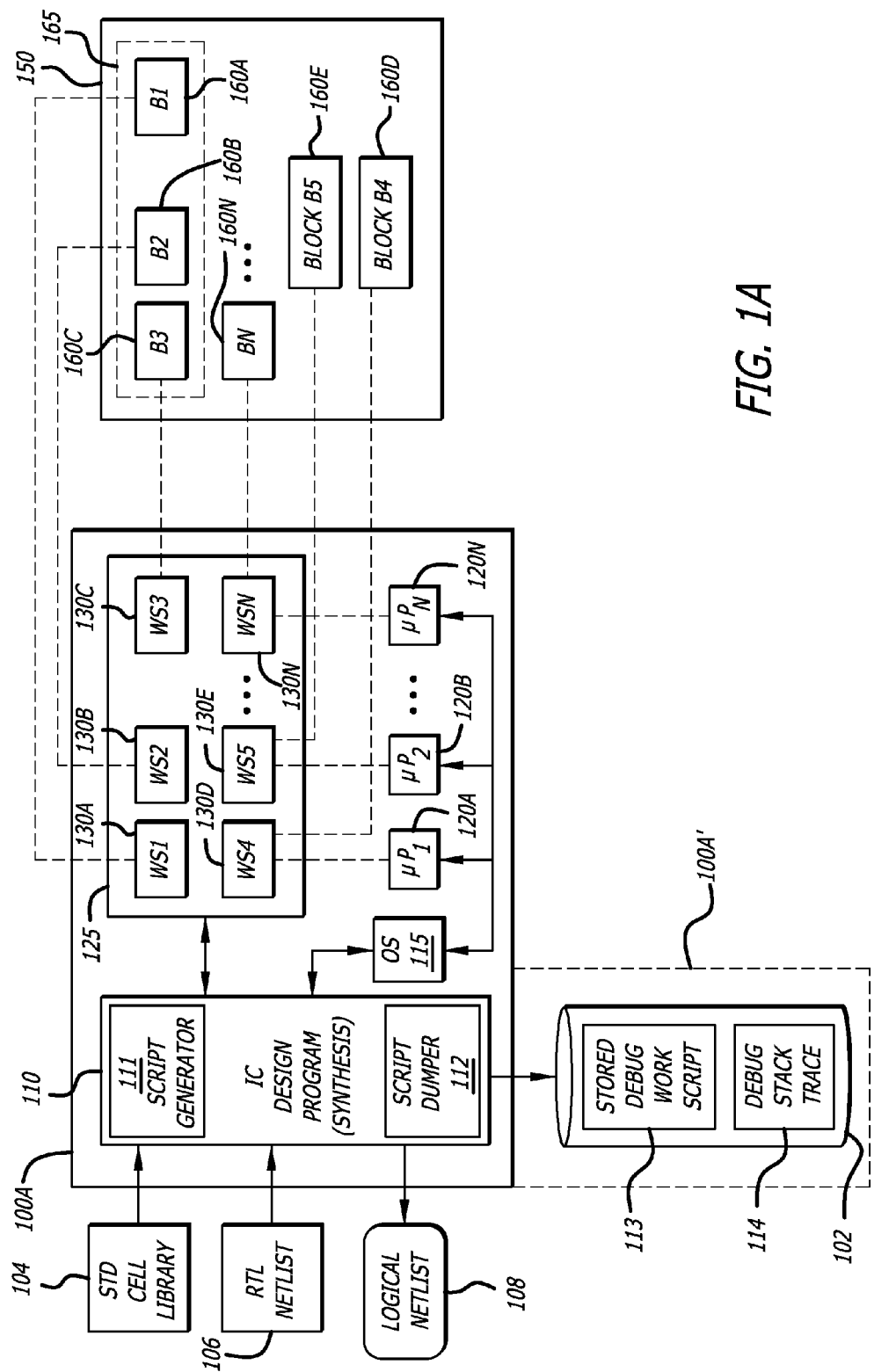
FIG. 1A is a block diagram illustrating an integrated circuit design program in a computer system that forms work scripts to generate blocks of an integrated circuit design.

In the following detailed description of the embodiments of the invention, numerous specific details are set forth in order to provide a thorough understanding of the present invention. However, it will be obvious to one skilled in the art that the embodiments of the invention may be practiced without these specific details. In other instances well known methods, procedures, components, software, and apparatus have not been described in detail so as not to unnecessarily obscure aspects of the embodiments of the invention.

Introduction

Some embodiments of the invention generate a sequence of commands forming work scripts that may be shared over a network of computers to divide up the work to be performed in designing an integrated circuit (IC) using IC design software.

Program Faults

In the case that a process goes fatal, indicating that a program fault may have occurred, a work script and a current register stack may be written out and saved into files of a storage element. The sequence of commands of a work script may be saved into a file, referred to as a debug work script file. The debug work script file indicates the portion of the integrated circuit being worked upon and provides the commands that were being executed before the program fault, as well as the command or commands being executed at the time of the fault.

As the debug work script file includes substantially all information needed to execute the IC design program and perform work on a portion of the IC design by one computer or processor, a netlist of the entire integrated circuit is not needed to debug a fault in the IC design program. A user need only send the debug work script file and optionally the standard cell library to a software developer to debug a fault in the IC design program. The debug work script file reduces the information previously needed from a user to debug a fault in an IC design program. The file size of the debug work script file is smaller and can be readily emailed by a user to the software developer. As the entire netlist of the integrated circuit is not needed to debug the IC design program, a user has less of a concern with protecting trade secrets.

Moreover, a user doesn't have to become involved in determining what portion of the IC netlist may have caused the program fault. The debug work script file contains the portion of the IC netlist that was being worked on by the IC program when the program fault occurred.

The software developer or programmer executes the debug work script file with the same version of the IC design program and the user's standard cell library or a sample standard cell library to debug the IC design program. As the debug work script file is performing work on a limited portion of a user's IC netlist, in comparison with the larger netlist originally input to the program by a user, its execution time to reach the program fault is reduced.

If a program fault occurs in a slave process or at a slave computer system executing a work script, the slave process shuts down and the master process doesn't receive any results back. After a period of time, the master process will notice that the slave process terminated. The master process then sends the same work script as a job to a next slave process. If the next slave process goes fatal with a program fault, the master process then sends the same work script as a job to the next slave process and so on and so forth. The master process repeatedly sends the same work script as a job to all of the available slave processes until they have all gone fatal and shut down. The master process then executes the failing work script as a job and if it goes fatal, the work script is written out as the debug work script file and the stack is also written out.

If a program fault occurs in a slave process or at a slave computer system executing a work script, the stack trace may be sent to the master process. The master process then locates the corresponding work script from memory or recreates the work script and writes it out as the debug work script file with the stack trace. The debug work script file is the work script that was executed by the slave process at the time of the program fault.

The name of the block and work script may be logged by the slave process and sent to the master process executed in the master computer system. Then as previously discussed, the master process can copy the sequence of commands of the work script in memory to a file or regenerate the sequence of commands of the work script and save it to a file as the debug work script file.

System of Scripts and Master-Slave Processes

Referring now to FIG. 1A, a block diagram of a computer system 100A including an integrated circuit design program 110 is illustrated. Also in FIG. 1A, a block diagram of an integrated circuit design 150 is illustrated for correlation to processes being performed by the computer system 100A. The computer system 100A may further include an operating system (OS) 115, one or more processors 120A-120N, and a volatile storage 125, such as memory and/or virtual memory.

The computer system 100A may internally include a non-volatile storage 102, such as a hard drive, to form the computer system 100A'. Otherwise, the non-volatile storage 102 may be external to the computer system 100A. The information stored in the non-volatile storage 102 is ordinarily not lost when the power is removed. In contrast, the information stored in the volatile storage 125 is lost when the computer system 100A is powered down.

The operating system (OS) 115 of the computer system 100A has a list of its one or more processors 120A-120N that it can use to execute program instructions. The operating system (OS) 115 may generate one or more processes for execution by the one or more processors 120A-120N. In executing the integrated circuit design program 110, one process is a master process while other processes are slave processes. The master process and the slave processes may be swapped around the one or more processors 120A-120N for execution. For example, the master process may be executed by one processor, such as processor 120A, for a first period of time and then be swapped to another processor, such as processor 120B, to be executed for another period of time. The operating system (OS) 115 essentially gives the processes slices of time on the available processors so that it appears that the integrated circuit design program is being run continuously on a single processor.

The integrated circuit design program 110 includes a script generator 111 to generate one or more work scripts 130A-130N to perform work on blocks 160A-160N of the integrated circuit design 150. At a high level, the task of performing work on the integrated circuit design is divided up by the script generator 111 in a block-by-block manner into the one or more work scripts 130A-130N that may be stored into the storage 125 for execution by the one or more processors 120A-120N. That is, blocks 160A-160N are partitions formed by the integrated circuit design program 110 to divide up the work to be performed that may or may not coincide with any blocks defined by the user.

In one embodiment of the invention, the integrated circuit design program 110 is a logic synthesizer that receives a standard cell library 104 and a register transfer level (RTL) netlist 106 to generate a logical netlist 108. In this case, the IC design program 110 generates the digital logic to perform the function of the blocks in the integrated circuit design and then optimizes the digital logic based on certain design constraints, such as arrival timing and area minimization.

A functional block 165 of the integrated circuit design 150 may include one or more sub-blocks 160A-160C. One or more work scripts 130A-130C may individually work on the one or more sub-blocks. Alternatively, a single work script may include the one or more sub-blocks 160A-160C to perform work on the functional block 165. Generally, a work script may include one or more leaf level blocks to generate a functional block 160N of the integrated circuit design. A leaf level block includes one or more gates and one or more nets or wire routes to inputs and outputs. Typically a leaf level block will include a plurality of gates, such as one or more of an inverter (not), buffer, or, and, xor, xnor, nand, and/or a nor gate. The plurality of gates may be abstract gates (also sometimes referred to as being generic gates or primitive gates) or they may be gates associated with a standard cell library. Random logic in the integrated circuit design may be grouped into one block and associated with a work script with or without other blocks. Otherwise there is little block hierarchy in a work script such that it is self contained and has substantially all information needed to perform work on a portion of the integrated circuit design.

For example, work script WS1 130A has substantially all information needed to perform work on block 160A of the integrated circuit design 150. Work script WS2 130B has substantially all information needed to perform work on block 160B of the integrated circuit design 150. Work script WS3 130C has substantially all information needed to perform work on block 160C of the integrated circuit design 150. Work script WS4 130D has substantially all information needed to perform work on block 160D of the integrated circuit design 150. This continues through n blocks of the integrated circuit design 150, n being a variable, with the nth work script WSN 130N having substantially all information needed to perform work on the nth block 160N of the integrated circuit design 150.

Super-Threading System

Figure 1B:
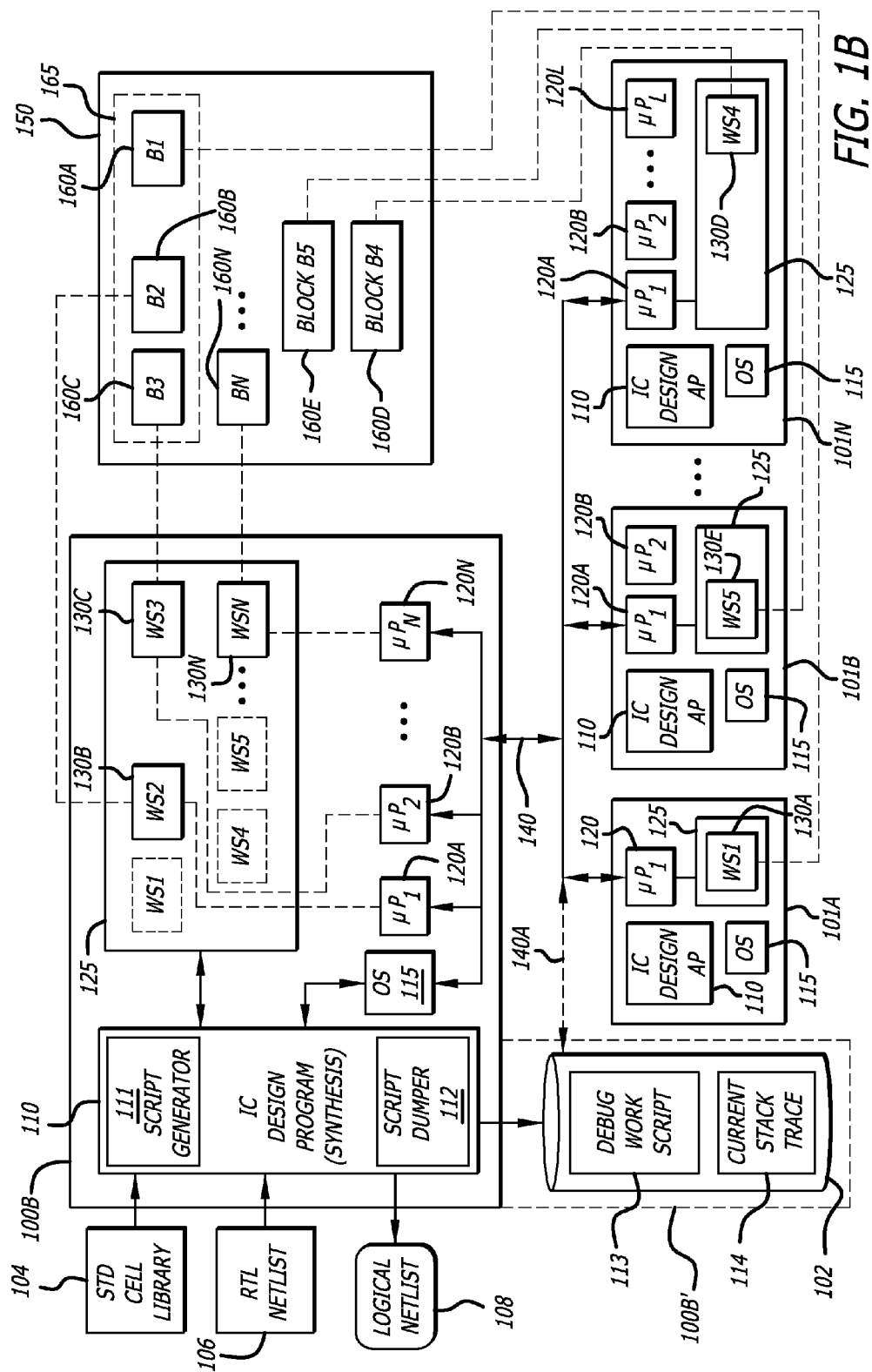
FIG. 1B is a block diagram illustrating an integrated circuit design program in a computer system that forms work scripts that are shared over a network with other computer systems to generate blocks of the integrated circuit design.

Referring now to FIG. 1B, a block diagram of computer systems 100B, 101A-101N is illustrated coupled together through a network 140. The computer systems 100B, 101A-101N may optionally be referred to as servers. Also in FIG. 1B, the block diagram of the integrated circuit design 150 is illustrated for correlation to processes being performed by the computer systems 100B, 101A-101N. The network 140 coupling the computer systems 100B, 101A-101N together may be a local area network (LAN), a wide area network (WAN), or a combination thereof. Each of the computer systems 100B, 101A-101N includes a copy of the integrated circuit design program 110 to execute if authorized by a license key mechanism. Computer system 100B may be substantially similar to computer system 100A. However, computer system 100B acts as a master computer including a master process to generate work scripts that are shared over the network 140 to the slave computer systems 101A-101N. With each of the computer systems 100B, 101A-101N having a copy of the integrated circuit design program 110, they may respectively perform work on blocks of the integrated circuit design 150 in response to the work scripts.

Additionally, each of the computer systems 100B, 101A-101N may have access to the standard cell library 104 to perform work on blocks of the integrated circuit design 150 in response to the work scripts. A shared file system, such as made available on the non-volatile storage 102, may be provided so that computer systems 100B, 101A-101N may access one or more libraries including the standard cell library. The master process generates an initialization script that is sent to each and every slave process after being launched. The initialization script includes general IC design program settings and library settings including the location of the shared file system where every slave process can access the standard cell library and any other library or database for performing work on the IC design 150.

Each of the computer systems 100B, 101A-101N may further include an operating system (OS) 115, one or more processors 120, and a volatile storage 125, such as memory and/or virtual memory. The computer system 100B may internally include a non-volatile storage 102, such as a hard drive, to form the computer system 100B'. Otherwise, the non-volatile storage 102 may be external and coupled to the computer system 100B or alternatively coupled to the network 140 as a networked attached storage device. The information stored in the non-volatile storage 102 is ordinarily not lost when the power is removed. In contrast, the information stored in the volatile storage 125 is lost when the computer system 100A is powered down.

As discussed previously, the computer systems 100B, 101A-101N respectively perform work on blocks of the integrated circuit design 150 over the network 140 using a copy of the integrated circuit design program 110 in response to the work scripts 130A-103N. Allowing work on blocks of the integrated circuit design 150 to be divided up and spread across a network to the computer systems 100B, 101A-101N is referred to as super-threading. In this case, the processes to perform work on the integrated circuit design 150 are spread across the network 140 from the master computer system 100B executing a master process to the slave computer systems 101A-101N executing slave processes. The master process in the computer system 100B may send work scripts out over the network 140 to the slave computer systems 101A-101N. For example, computer system 101A may execute the work script WS1 130A to work on block B1 160A of the integrated circuit design 150. Computer system 101B may execute the work script WS5 130E to work on block B5 160E of the integrated circuit design 150, and so on and so forth, to the Nth computer system 101N that may execute the work script WS4 130D to work on block B4 160D of the integrated circuit design 150.

Super-threading takes advantage of the larger memory capacity that is available today given the lower memory prices per megabyte. With super-threading, a copy of the IC design program 110 in a computer system is duplicated and loaded into memory for each processor within each computer system 100B, 101A-101N so that they can be independently executed with the work script without sharing memory. For example, the computer system 101B has two processors 120A-120B. Two copies of the IC design program 110 can be read into memory 125 of the computer system 101B to independently execute two work scripts using the two processors 120A-120B and perform work on two blocks of the integrated circuit design 150. The memory 125 may be split into two independent memory portions for the respective processors 120A-120B. That is, super-threading does not share memory space between processors so that the work can be independent and split up to be sent across a network to different computer systems. With the IC design work being split up into multiple processes to be performed by different computer systems or servers over the network, more work can be done in parallel by additional processors. Thus, the overall time for the IC design program 110 to perform work on the entire IC design 150 can be reduced by using super-threading.

In contrast, normal threading (i.e., non-super-threading) refers to a single computer system with a single copy of an application program being run on multiple processors using shared memory with different threads of execution. That is, different threads of execution are run on the multiple processors of the single computer system or machine using a shared memory and not over a network on different computer systems using different independent memory space. Normal threading requires a shared memory model to run an application on the same system so that the different processors all have access to the same memory. It is impractical to share a fast memory space across a network to execute an application. Thus with normal threading using a shared memory model, work of an application can not be readily split up and shared with other computer systems across a network.

Additionally with a shared memory in the ordinary threading case, it is easier to have program faults or bugs occur where one process touches some memory that it shouldn't have touched and disrupts another process. That is, sharing memory makes it more likely that a problem or a bug in the application program will occur. Additionally with shared memory in normal threading, synchronizing updates into the shared memory is very problematic and if a program fault occurs it can be very difficult to discover and reproduce.

Moreover with a shared memory limiting execution to a single computer system, the application program can only use as many processors that are available to that single computer system. Normal threading does not allow different computer systems on a network to be used to perform work on the same integrated circuit design using the same application program at substantially the same time.

In case of a program fault in executing the IC design program, the master process executing in the computer system 100B may have saved the one or more work scripts WS1 130A, WS4 130D, WS5 130E (as indicated by dashed line blocks in storage 125) that were sent out over the network 140 to the slave computer systems 101A-101N in its storage 125. Alternatively, the master process being executed in the master computer 100B may not save work scripts to memory to conserve memory usage. If a program fault occurs, the master process executed in the master computer may then simply recreate the work script that was being executed during the program fault and save it to a file on a disk, such as a hard drive or other non-volatile storage 102, as the debug work script file.

Work Scripts and Debug Work Script Files

Figure 2:
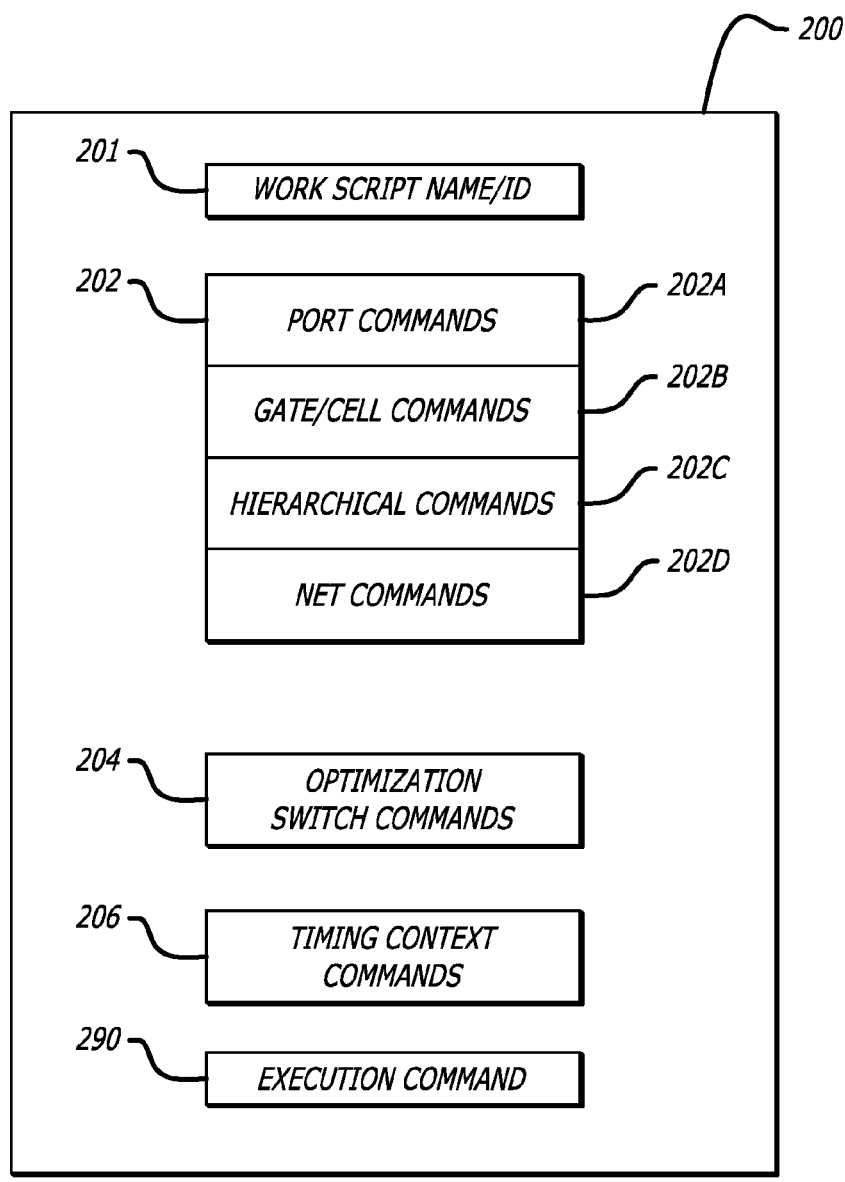
FIG. 2 is a simplified block diagram of a sequence of commands forming a work script.

Referring now to FIG. 2, a simplified block diagram of the sequence of commands of a work script 200 are illustrated. The work script 200 in a command format fully encapsulates the work that a process is to perform on an integrated circuit. There are a couple of types of work scripts, a pre-work script and a post-work script. A pre-work script is a sequence of commands issued by the master process that are communicated over a TCL communication channel to a slave process. As the sequence of commands is received by the slave process, they can be coincidentally executed without waiting for other commands in the sequence. The sequence of commands communicated over the TCL channel may be interrupted by a command that is not part of the pre-work script. A post-work script is a sequence of commands issued by the slave that are communicated over a TCL communication channel to the master process. As the sequence of commands is received by the master process, they can be executed coincidentally without waiting for other commands in the sequence. The sequence of commands communicated over the TCL channel may be interrupted by a command that is not part of the post-work script.

In case of a program fault, the commands of a pre-work script can be saved to non-volatile storage as a debug work script file. The pre-work script includes substantially all the design, constraints, and directives to perform work on a portion of an integrated circuit design. In one embodiment of the invention, work scripts are used to optimize the logic of one or more blocks of an integrated circuit design.

The work script 200 generally includes a name 201 or other identification (ID), netlist generation commands 202, optimization switch commands 204, timing context commands 206, and an execution command 290. While the name 201, netlist generation commands 202, optimization switch commands 204, timing context commands 206, and execution command 290 are grouped together and illustrated in order from top to bottom in the work script 200. FIG. 2 is only an exemplary illustration in that the commands do not have to be grouped together or placed in any particular order in a work script. For example, some optimization switch commands may be written at the beginning of the work script as well written in between the netlist generation commands 202 and the timing context commands 206.

The work script name 201 is used to identify the work script in the one or more computer systems 100A, 100B, 101A-101N, whether it is sent over a network or not. The work script name 201 is also used to identify the debug work script file that is the work script saved to non-volatile storage upon program fault.

The execution command 290 instructs a processor to execute the IC design program in response to the netlist generation commands 202, the optimization switch commands 204, and the timing context commands 206.

The netlist generation commands 202 are basically used to recreate a netlist representation of the blocks/partitions of the IC design 150 to divide up the work between processes and computer systems. The netlist generation commands 202 generate one or more gates and one or more nets of a netlist representing a portion of the integrated circuit design. The one or more nets are the connecting segments or wires to connect the one or more gates together or to couple the inputs and outputs of the gates to respective input and output pins of a block. The netlist generation commands 202 may also form the inputs and outputs to the netlist. The netlist generation commands 202 allow a netlist to be communicated across a TCL communication channel between a master process and one or more slave processes.

The netlist generation commands 202 may include port commands 202A, gate/cell commands 202B, hierarchical commands 202C, and/or net commands 202D. Generally, the port commands ("po") 202A define the input and output ports or pins of the various levels of netlist hierarchy. The gate/cell commands ("g") 202B generate one or more gates or cells of the netlist. The hierarchical commands ("ui", "hi") 202C may be used to generate one or more blocks and/or sub-blocks of hierarchy in the netlist. The net commands ("n") 202D are used to generate the one or more nets or interconnections of the netlist to connect input/output ports, gates, cells, blocks, and sub-blocks together.

The timing context commands 206 include input timing, such arrival timing of input signals, and other timing contexts for the netlist, such as clock periods or clock frequencies of one or more clocks. The timing context commands 206 may further include timing constraints, such as the expected arrival timing of output signals.

The optimization switch commands 204 are parameters related to integrated circuit design in which the work is performed on the integrated circuit. In one embodiment of the invention, the optimization switch commands are settings of different parameters for the optimization of logic in the portion of the integrated circuit. For example, one optimization switch may be to designate whether or not the flip-flops in the IC design are to be mapped to include a design for test (dft) functionality.

Referring now to FIG. 3 (FIGS. 3-1 through 3-6), a portion a work script 300 in ASCII text including exemplary portions of a sequence of commands for an unsigned adder is illustrated. In one embodiment of the invention, the syntax of the work script is written in a scripting language, such as the tool command language (TCL, that is pronounced "tickle"). A script interpreter is used to parse the work script to operate on a block of the integrated circuit design.

A first command 310 provides sets a variable to the name of the work script 300. It is basically a command that stores the ASCII string representing the name of the work script, "add unsigned" for example, in a variable called rc_st. This is the name used to identify a work script when it fails that is written out to a file as the debug work script file. Also when the work script is completed successfully with the results being sent to the main process, the work script name is associated with the results so the main process knows it has been completed.

The second command 312 is a version check in the case that the work script needs to be rerun as a debug work script file. Ordinarily, it is unused. The "if" statement compares the version of the IC design program that wrote the work script with the IC design program that is to execute the work script by means of a database version identifier "DB". If there is a mismatch in the database version identifiers, then an error is indicated and the differing identifiers are printed out to a user. This assures that when the debug work script file is rerun by a programmer, it is being executed with the same version of the IC design program that a user was using. Thus, if the debug work script file is not loaded by the same version of the IC design tool, it will report out an error. It may be the case that the program fault was previously repaired in the user's version. In which case, a user may need only to download a later version of the IC design program with the bug fix.

The third command 314, a set command, initializes a design shell that is to be filled in as the work script is executed. The design shell is empty in that it doesn't even have anything to print out yet.

The fourth command 316, a pushd command, basically sets a variable so that certain commands that follow know how to refer to the design set by the third command 314. Commands 318, 320, and 322 all have a dot at their end to point to the current object. The pushd command 316 sets the current object to be the design shell that was initialized by the third command 314.

Commands 318, 320, 321, and 322 basically set attributes for the current design that the IC design program is responsive to. In one embodiment of the invention, one or more of the commands 318, 320, 322 may set optimization settings to optimize a logical design during logic synthesis. For example, the "comp_builder_info" in command 320 tells the program that the given portion of the design is an adder and that there are special optimizations that can be performed knowing that this portion of the design is an adder.

Command 321, "speed_grade", is normally a non-user selectable attribute related to the speed grade of the design. In this case, the speed grade is set to "very_fast" such that it instructs the IC design program that the adder is currently a very fast adder.

Commands 302A-302D generally form the netlist generation commands 202 described previously with reference to FIG. 2.

Command 302A, "po" (pin-out), describes the pin out of the design that is to be worked on. That is, the 'po' command 302A creates the inputs and outputs for the netlist. For example, the PO command 302A describes inputs A and B and output Z having bits fifteen down to zero such that each are sixteen bits wide. The PO command may specify the width of the adder. In this example, the adder may be a sixteen bit wide adder.

Commands 302B is a list of the gates within the portion or block of the IC design being worked upon. For example, the listed gates may be those of a sixteen bit adder. The "pi" represents that the gates are primitive instances at the leaf level. However, the list of gates may also include sub-blocks, such as half adders or full adders for example, that in themselves include one or more gates or leaf level cells.

Commands 302C is a list of all of the nets ("n") used to interconnect the list of gates in the commands 302B. Each command may refer to the name of a gate and certain inputs of the gate to be coupled to an output of another gate. For example consider net "n_1", bit fifteen of input A is coupled to input zero (in_0) of both gates g1 and g2 which are therefore coupled together.

The commands 302B and 302C may be generated from a high level description of the integrated circuit design, a mapped netlist, or a generic netlist without any mapping or reference to circuit cells of a standard cell library. A mapped netlist has references to circuit cells. Some logical synthesis may take place of an IC design described in the high level description language to generate these commands. The netlist formed by the commands 302B-302C may be functionally correct but have yet to consider any one timing or other design constraint in one embodiment of the invention. The work scripts may be used to optimize the technology mapping of a portion of the IC design in response to the standard cell library to generate a mapped netlist. In another embodiment of the invention, the work scripts may be used to optimize a portion of the IC design with constraints on the design, such as timing, with or without reference to a standard cell library, to optimize a generic netlist or a mapped netlist. Optimizations performed by the IC design program may be executed multiple times with and without super-threading to obtain a desired outcome generating a generic or mapped netlist as part of the output results.

The commands 302D, "de" and "ne", are current settings of the netlist database used by the IC design program, sort of an internal calendar. These current settings of the netlist database are used so that any remote execution of the work script on a slave or remote computer system matches exactly what was used on the master or initiating computer system.

The command 330, a popd command, causes an internal variable to point to what it pointed to before a corresponding pushd was executed. In this case, the popd command causes the pointer to point as it did prior to the pushd command 316.

Command 332 includes the optimization switches for optimizing the work to be performed on the given portion of the netlist of the integrated circuit design. In one embodiment of the invention, the optimizing performed on the given netlist is to optimize the logic design given certain constraints. This corresponds to the optimization switch commands 204 previously described with reference to FIG. 2.

Command 332 also makes a call to a standard cell library. If the user standard cell library is provided to the programmer for debug purposes, the debug work script file can be run as it is. If not, a substitute standard cell library may instead be used by the software engineer or programmer to execute the debug work script file. The name of the call to the customer's standard cell library is then replaced to call the substitute standard cell library. A program fault may not be responsive to the standard cell library and may occur without doing anything that is specific to the library. In which case, the substitute standard cell library doesn't need to exactly match a user's standard cell library during debug of a program fault. Generally, prior to running a work script, another script is run to load the standard cell library into memory so that it can be used by each work script. If a remote process is to be launched at a slave computer system, a script is run to load the standard cell library into memory of that remote computer system for use with the remote execution of the work script.

Command 334, an eval pushd command, is used to set the "." to reference the top level design.

Command 336, a set attribute command, switches on a scan mode to be used by the IC design program to add a test scanning capability to the netlist of the IC design so that a scan of the flip flops can be made during testing and debug of the manufactured integrated circuit.

Command 338, another popd command is executed to undo any reference that the "." may have had.

Command 340, a move ("mv") command, basically renames the design so that it is properly named. In this example, the design shell is renamed to "add unsigned". Normally the design would already be properly named. However, if the work script is executed within the main or master server within the main process that launched it, there may be a name collision. In this case, the move command 240 assures that the design is properly named.

Commands 306A-306C generally form the timing context commands 206 described previously with reference to FIG. 2. The map_clock command of the commands 306A defines the timing of a clock, "clock1". That is, it basically describes the waveform of clock1 and its different settings provided by a user. The map_sa 2 and map_sa 4 of commands 306A map the number 2 for later reference to the rising edge of clock1 and the number 4 for later reference to the falling edge of clock1.

Commands 306B map input arrival times of signals at the input ports or input pins. That is, each bit of input port A and input port B has a signal input arrival time assigned by the commands 306B. For example, the first command in the set of commands 306B assigns the arrival time of signals at bit zero (A0) of input port A. Thus, there are sixteen commands to assign arrival times for sixteen bits of input port A and sixteen commands to assign arrival times for sixteen bits of input port B.

Commands 306C sets the required output timing for each of the bits of output port Z. For example, the first command in the set of commands 306C sets the required output timing of bit zero of the Z output port. Thus, there are sixteen commands to assign the required output timing for sixteen bits of output port Z. These are the output required times when the output signal must be stable. The required output timing of the output port, a design constraint, may influence the work that is performed on the IC design by the IC design program. In one embodiment of the invention, the logic is optimized such that it will meet this constraint given the input arrival timing.

Commands 344 may be used to set resistive and/or capacitive loads on each of the bits of the output port Z that are to be driven by the design. Thus, there are sixteen commands to assign the required output loading for the sixteen bits of output port Z. In this manner, the size of the output driver for each output bit may be determined for the IC by the IC design program to meet design constraints for this portion of the netlist.

Command 390, an eval command, is the command to the computer system to run the IC design program to perform certain work on the IC design defined by the work script and obtain a set of results. The results maybe written back to the same place from where the work script was received.

If at a remote or slave computer system, the work script and its commands are received at a UNIX socket, for example. The remote computer system writes commands back to the same UNIX socket in a result script telling the master process of the results and how to recreate the results that have been completed. In one embodiment of the invention, the result script includes a refined netlist of that portion of the IC design over which the work script performed work. The refined netlist may be smaller in that logic may have been reduced and simplified to use less area on an integrated circuit. Performance of the refined netlist may have been optimized on certain data paths by eliminating a number of gates and their associated gate delays or by adding new gates to buffer any loads to meet timing requirements. The nets defining the interconnections may also have changed or been eliminated in the refined netlist to match any reduction of gates in certain data paths, any logic simplification, any new connections to new gates, or any connection changes between gates.

Execution of a work script is independent of the computer system that performs the work, provided of course that the computer system has the proper operating system and processor to execute the IC design program. That is, the results generated by executing a work script are substantially the same regardless of what computer system executed the work script when using the same version of the IC design program. This is because a work script substantially contains most information needed to perform work on a portion of an IC design. A plurality of work scripts can be executed in parallel to generate the blocks of the IC design with the results of each being then assembled together by a master process to form the overall netlist of the IC design.

The commands of the work scripts can be sent across a network to be executed remotely. Alternatively, the same commands of the work scripts can be executed locally. Either way the results generated by the remote and local execution of the same work script with the same IC design program should be substantially the same. Therefore if the IC design program has a fault, execution of the commands in a debug work script file should generate the same fault with the same version of IC design program whether executed remotely or locally regardless of the computer system that executes the commands in the debug work script file.

Work Scripts and Super-Threading

Figure 9A:
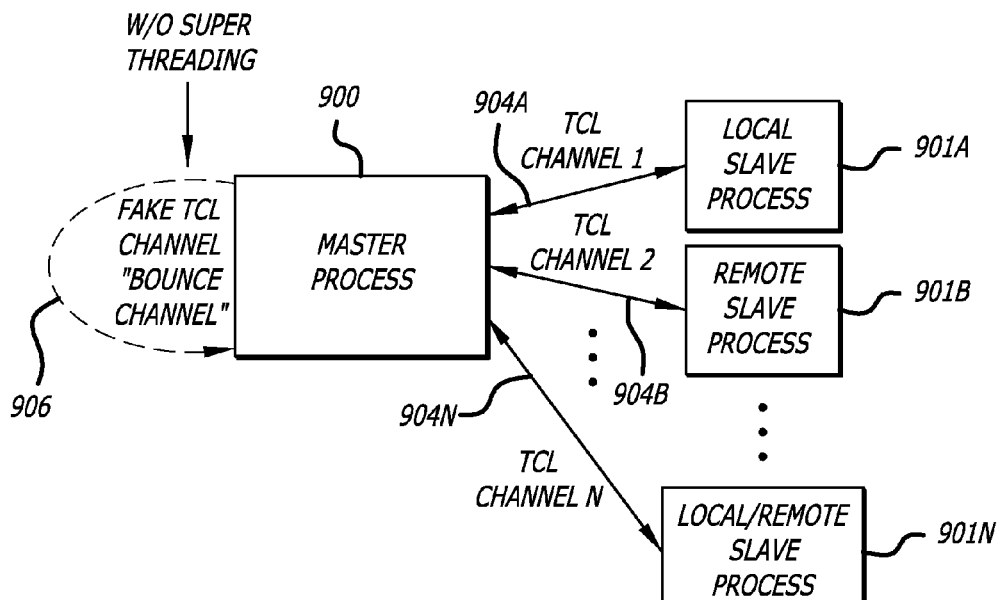
FIG. 9A is a block diagram illustrating the communication channels between a master process and one or more slave processes to support super-threading.

Referring now to FIG. 9A, a master process 900 communicates with slave processes 901A-901N over TCL communication channels 904A-904N, if super-threading is enabled. If super-threading is not enabled, a fake TCL communication channel (also referred to as a "bounce channel") 906 is utilized by the master process 900 to carry out the work of the IC design program on an IC design. With a fake TCL communication channel 906, the master process 900 doesn't send any commands to another process. Instead, the master process 900 executes the commands as they are written into the fake TCL communication channel 906. Otherwise in the following discussion, it is assumed that super-threading is enabled and a master computer with multiple processors and/or slave computers or servers with one or more processors are available for use by the IC design program as illustrated in FIG. 1B.

A slave process may be a local slave process or a remote slave process. A local slave process is executed coincidentally with the master process 900 within the master computer as it has multiple processors. For example, local slave process 901A is a slave process that is executed on the same machine as the master process 900 without the use of a local area network (LAN) or a wide area network (WAN).

In contrast, a remote slave process is executed on a slave computer system that is separate and apart from the master computer. The slave computer system and the master computer system are interconnected by a network connection such as in a local area network (LAN) or a wide area network (WAN). For example, the remote slave process 901B may be executed by a slave computer in a first city while the master process 900 may be executed by a master process in a second city different from the first. The TCL communication channel 904B between the master process 900 and the remote slave process 901B is across a local area network (LAN) or a wide area network (WAN).

Figure 9B:
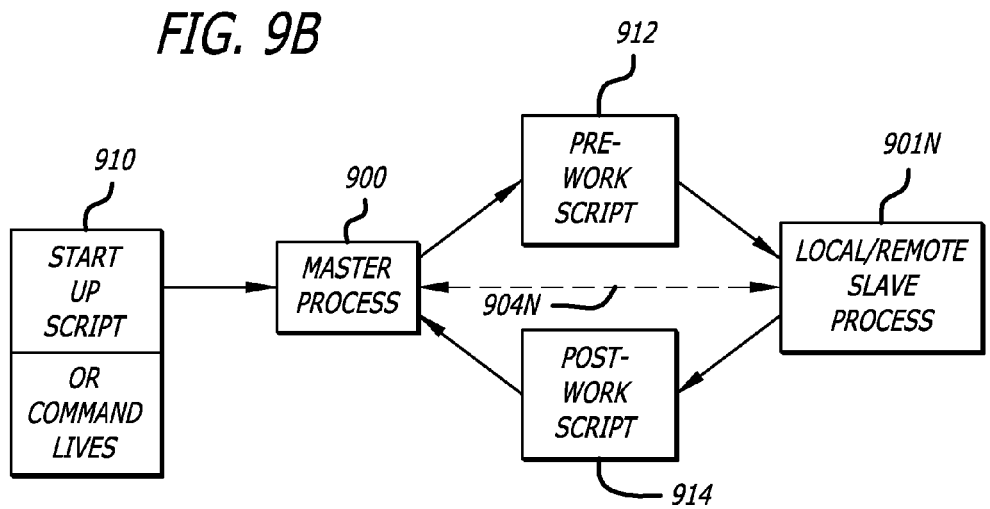
FIG. 9B is a block diagram illustrating the work script communication between a master process and a slave process to support super-threading.

Referring now to FIG. 9B, work script communication over a TCL communication channel 904N is illustrated between a master process 900 and a local/remote slave process 901N. To initiate work script communication over the TCL communication channel 904N, a start up script 910 or a similar series of command lines provided by a user are executed by the IC design application program on the master computer so that the master process 900 for the IC design program is generated.

Assuming that super-threading is enabled, the master process 900 generates a sequence of commands of a pre work script 912 in response to an RTL netlist or higher-level description language (HDL) of an IC design or portion thereof supplied by the user. The pre-work script 912 includes netlist commands describing a portion of the IC design. The netlist commands may be generated by partitioning an IC design or a functional block in a number of ways in response to the type of work to be performed. For example, if area optimization of the logic is to be performed, the partition of the IC design may be substantially similar to the user's hierarchy in the RTL netlist. However if timing optimization of the logic is to be performed, for example, a more complicated partitioning of the RTL netlist of the IC design may be performed so that the delay paths across a user's hierarchy can be properly considered.

The commands of the pre-work script 912 are communicated from the master process 900 over the TCL communication channel 904N to the slave process 901N. As the sequence of commands of the pre-work script 912 are being received, the slave process may coincidentally execute the commands without waiting for others in the sequence. Executing the sequence of commands reconstructs a netlist of the IC design that the IC design program may work upon. Using the IC design program, the slave process 901N performs work on the received netlist of the IC design and generates a sequence of commands of a post work script 914 which are the results of the work. The commands of the post work script 914, including a new netlist portion in a sequence of netlist command lines, is communicated by the slave process 901N back to the master process 900 over the same TCL channel from which the commands of the pre-work script were received. The master process 900 executes the commands of the post work script 914 as they are received to reconstruct the new netlist and then substitutes the new netlist portion generated by the work performed for an old netlist portion in the RTL design.

Referring now to FIG. 10, an exemplary start up script 1000 is illustrated.

The start-up script includes command lines 1001-1007. The command lines may be part of a file or alternatively be entered in manually line by line.

In command line 1001, the library attribute that is set defines the standard cell or other circuit cell library, sometimes referred to as the technology library, that is to be used to perform work on the IC design.

Command line 1002, the read_hdl command reads in a users RTL netlist in a high level description language such as verilog. The user's RTL netlist may be of a complete chip or a portion thereof, such as a functional block. In this case, the users RTL netlist is a functional block named alu.v that is a verilog file that is to be read.

In command line 1003, the define_clock command defines one or more clocks for the user's RTL netlist with a timing constraint. In this example, a ten nano-second clock waveform is defined and applied to the clock input port of the RTL netlist. This clock may be the one or more master clocks of the entire IC design.

In command line 1004, the attribute super_thread_servers that is set defines the computer systems, machines, or servers that a user allows the IC design program to use for super-threading of multiple slave processes. Enclosed in brackets are the machine names RCL101, RCL102, RCL103 on a network that may be used to execute slave processes under control of the master process on the master computer. If more than one slave process can be executed on a machine, the machine name is repeated in brackets as to how many slave processes can be executed on processors.

In command line 1005, the set command turns on debug logging that causes all work scripts communicated over a TCL channel to be saved into a directory in the non-volatile storage. The directory may be called "debug" in the exemplary start up script but may take on any other name. Debug logging is described in greater detail below with reference to FIGS. 17-18.

In command line 1006, a run command is given to the IC design program to perform work on the user's RTL netlist. In this example, the command techmap is issued to optimize the user's RTL netlist and map it to the gates of the standard cell library.

In command line 1007, after the work is completed by the IC design program, the write command writes out the resulting netlist into a file. In the example of FIG. 10, the resulting mapped netlist is written out into a filename alu_m.v.

Referring now to FIG. 11, exemplary sequence of commands of a pre work script 1100 are illustrated. The exemplary pre work script 1100 includes a sequence of netlist commands that corresponds to the schematic diagram illustrated in FIG. 16A. FIG. 3 illustrates a portion of another pre-work script. Provided that a proper hierarchical level is chosen by the pushd and popd commands, the netlist generation commands may be interspersed within the sequence of commands of a work script.

In FIG. 11, command line 1101 states the job name, "selector" for example, and remembers if for later use. That is, the job name is stored in variable rc_st:bg:job.

Command line 1112 supports the debug work script file and debug logging that may have been generated by different computer systems. The command line 1112 assures that we read the RTL netlist with an appropriate software version of an RTL compiler with which it is compatible. If the software version is incompatible, execution of the commands in the work script stop and an error message is issued.

In command line 1103, a set command names the work script and initializes the new design "st mux opto".

In command line 1104, a pushd command sets up the following lines to refer and add to the top level of the new design st mux opto. Lines 1105 and 1102B1 refer to the top level of the design st mux opto.

Figure 16A:
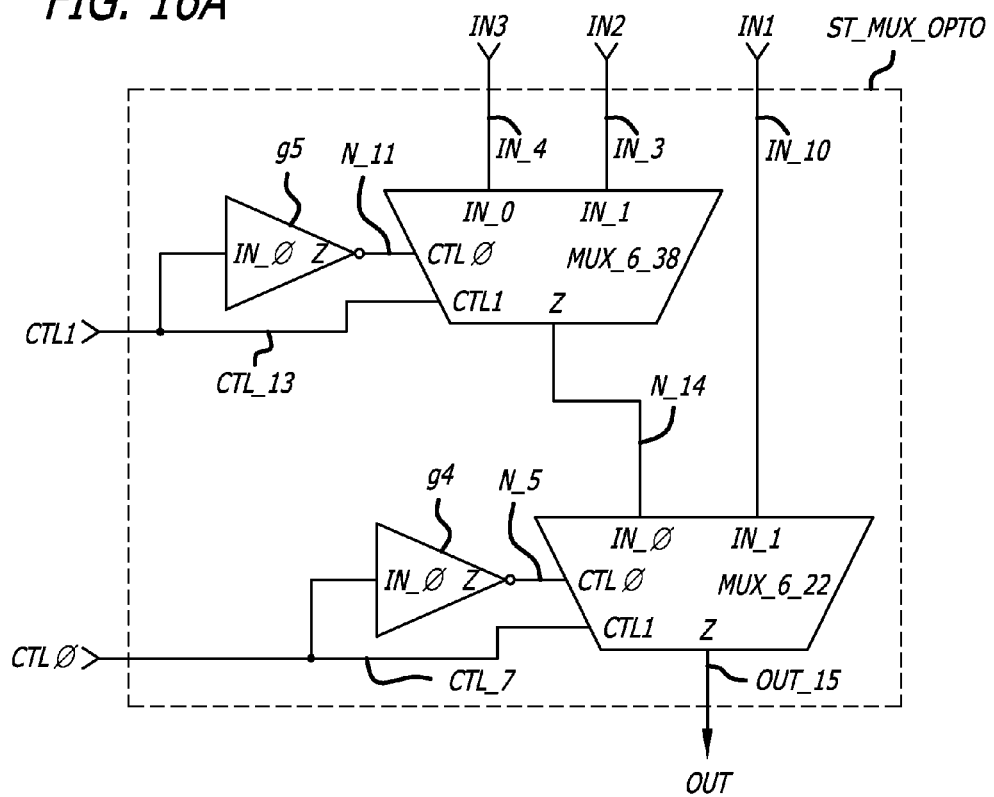
FIG. 16A is a schematic diagram of the netlist defined by the netlist commands of the exemplary pre-work script of FIG. 11.

In command line 1102A1, a port "PO" command, the primary input and output ports for the design st mux opto are defined. A bus CTL is defined to have two bits, bit 1 and bit 0 that are referred to herein as CTL 1 and CTL 0 as illustrated in FIG. 16A. The port command also defines the input ports in1, in2, in3, and the output port out as illustrated in FIG. 16A. Command line 1102A, a port command, is a netlist generation command.

In command lines 1102B1, a pair of primary instance "pi" commands, a pair of not gates or inverters g4 and g5 are instantiated as illustrated in FIG. 16A. Each gate g4 and g5 has a single input as indicated by the ending "1" in each line. Command lines 1102B1, a pair of primary instance "pi" commands, are netlist generation commands.

Command lines 1120 include a pair of pushd commands and a set attribute command. The first pushd command is actually two commands in one. It first defines an hierarchical instance ("ui" command) of a block name "mux_6_22" as a multiplexer and then changes the overall reference in the program to that block name so that the following lines refer to "mux_6_22" and not the top level block name "st mux opto". The second pushd command is to get attributes of a known sub design for a multiplexer. The set attribute command then attaches the sub design of the multiplexer to the name "mux". The instantiation of the multiplexer "mux_6_22" is illustrated in FIG. 16A.

Command line 1130A, a popd command, undoes the pushd command 1120 so that any further set attribute commands that include a dot "." does not refer to anything anymore and the "mux_6_22" block is being referenced once again.

Command line 1102A2, a port command, defines the input and output ports of the "mux_6_22" block as illustrated in FIG. 16A. The inputs include a control bus with a bit 1 and a bit 0 (referred to as CTL1 and CTL0), and signal inputs in_0 and in_1; while the output port is Z. As only two input ports are defined, the "mux_6_22" block is a two input to one output multiplexer. Command lines 110A2, a port command, is a netlist generation command.

Command line 1123 is a design extras command that may set internal counter settings of a design.

Command line 1130B, a popd command, changes the level of hierarchy again to point back to what was pointed to before, the top level of the design block name "st mux opto".

Command line 1102B2, a hierarchical instance ("UI") command, instantiates a second multiplexer named "mux_6_38" defined as a multiplexer having the same input output ports and sub-design as "mux_6_22". A hierarchical instance command creates another level of hierarchy in the netlist of the design. Command line 110B2, a hierarchical instance ("UI") command, is a netlist generation command.

Command lines 1102C, are net (n) commands that define the named interconnections between ports and pins of the blocks and gates. The named interconnections listed are shown in FIG. 16A. Consider the first net command line of the command lines 1102C of the net name "ctl_13". But for the last, each bracket provides a block or gate name with the pin or port name that is to coupled to the net ctl_13. The last bracket includes a dot (".") to refer to the multiplexer mux_6_38. The first number in each bracket represents a load that may be applied to the net by the pin. The ctl 1 signal has a load of one that is applied to ctl_13. The last number represents a bit number of a bus if the signal to be coupled is part of a bus. If the signal is not part of a bus, the default value is zero. Bit 1 of the control bus of mux_6_22 is to coupled to the net ctl_13. Command lines 1102C, net ("n") commands, are netlist generation commands.

Command line 1158 is a design extras command that may set internal counter values of a design to correct initial values. This is transparent to a user.

Command line 1160 is a netlist extras command that may set the effort level that the IC design program is to apply to the design. The effort level may be set to a high effort level, a medium effort level, or a low effort level in performing work on the IC design.

Command lines 1140 and 1130D, a pushd command and a popd command, assures that we are now referencing the st_mux_opto block at its top level for the next sequence of command lines.

Command line 1164, while unnecessary in this particular example, may be used to communicate the effort level the IC design program is to put into the work that is performed (such as an effort level of optimization) or if any specific type of work should be disabled and not performed by the IC design program (such as disabling a particular type of optimization for example).

Command line 1165 is the command that causes the IC design program to operate in the background (bg) and perform work on the st_mux_opto block and write the resulting post-work script back into the same TCL socket and TCL channel that it reads from. In the particular example, the IC design program performs a mux optimization on the received netlist from the commands of the pre-work script 1100 and then writes the results as the commands of a post-work script 1200 over the TCL channel.

The pre-work script 1100 illustrated in FIG. 11 is only an example as the pre-work scripts can be much more complicated in hierarchy and in the number of gates.

Referring now to FIG. 12, an exemplary sequence of commands of a post work script 1200 are illustrated. The exemplary post work script 1200 includes a sequence of netlist commands that corresponds to the schematic diagram illustrated in FIG. 16B and are the results of executing an IC design program in response to the pre-work script 1100.

Figure 16B:
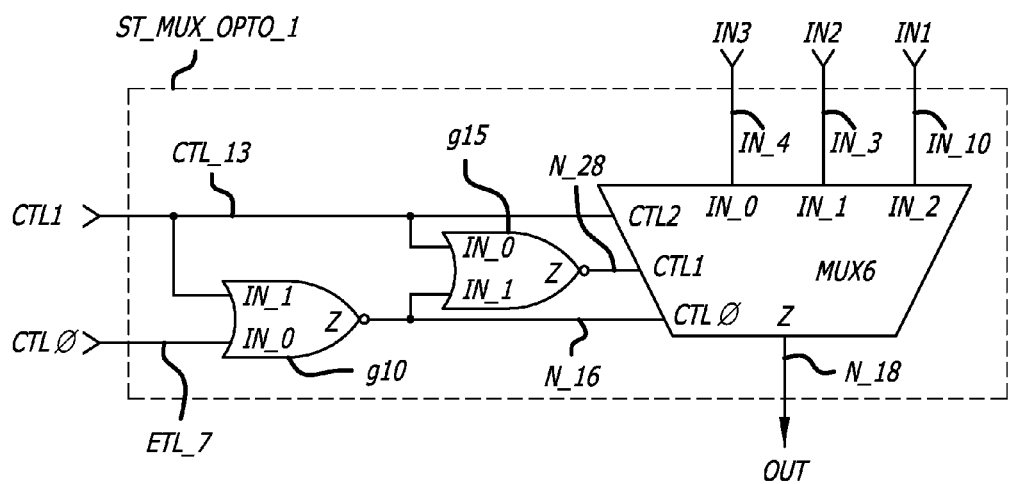
FIG. 16B is a schematic diagram of the netlist defined by the netlist commands of the exemplary post-work script of FIG. 12.

The post-work script 1200 has a simpler netlist than the pre-work script 1100 as it underwent a mux optimization process to reduce the number of multiplexers that are in series along a data path to minimize area usage while at the same time reducing the delay time in the data path. However, the post-work script has more complicated control logic for the one multiplexer as is illustrated in FIG. 16B. The type of commands used in the post-work script may be similar to those used in the pre-work script but form a different netlist.

Command line 1201 supports the debug work script file that may be generated as well as debug logging described herein. The command line 1201 assures that we read the RTL netlist with an appropriate software version of an RTL compiler with which it is compatible. If the software version is incompatible, execution of the commands in the work script stop and an error message is issued.

In command line 1203, a set command names the work script and initializes the new design "st mux opto_1" that is to replace the old design "st mux opto".

In command line 1204, a pushd command sets up the following lines to refer and add to the top level of the new design st mux opto_1. Line 1202A1 refers to the top level of the design st mux opto_1.

In command line 1202A1, a port "PO" command, the primary input and output ports for the design st mux opto_1 are defined. A bus CTL is defined to have two bits, bit 1 and bit 0 that are referred to herein as CTL 1 and CTL 0 as illustrated in FIG. 16B. The port command also defines the input ports in1, in2, in3, and the output port out as illustrated in FIG. 16B. Command line 1202A1, a port command, is a netlist generation command.

Command lines 1220 include a pair of pushd commands and a set attribute command. The first pushd command is actually two commands in one. It first defines an hierarchical instance ("hi" command) of a block name "mux6" as a multiplexer and then changes the overall reference in the program to that block name so that the following lines refer to "mux6" and not the top level block name "st mux opto_1". The second pushd command is to get attributes of a known sub design for a multiplexer. The set attribute command then attaches the sub design of the multiplexer to the name "mux". The instantiation of the multiplexer "mux6" is illustrated in FIG. 16B.

Command line 1230A, a popd command, undoes the pushd command of the commands 1220 so that any further set attribute commands that include a dot "." does not refer to anything anymore and the "mux6" block is being referenced once again.

Command line 1202A2, a port command, defines the input and output ports of the "mux6" block as illustrated in FIG.

16B. The inputs include a control bus with bits 2 through bit 0 (referred to as CTL2, CTL1 and CTL0), and signal inputs in_0, in_1, and in_2; while the output port is Z. As three input ports are defined, the "mux6" block is a three input to one output multiplexer. Command lines 120A2, a port command, is a netlist generation command.

Command line 1223 is a design extras command that may set internal counter settings of a design.

Command line 1230B, a popd command, changes the level of hierarchy again to point back to what was pointed to before, the top level of the design block name "st mux opto_1".

In command lines 1202B, a pair of primary instance "pi" commands, a pair of two input nor gates g10 and g15 are instantiated as illustrated in FIG. 16B. Each gate g10 and g15 has two inputs as indicated by the ending "2" in each line. Command lines 1202B, a pair of primary instance "pi" commands, are netlist generation commands.

Command lines 1202C, are net (n) commands that define the named interconnections between ports and pins of the blocks and gates. The named interconnections listed are shown in FIG. 16B. Consider the first net command line of the command lines 1202C of the net name "ctl_13". But for the last, each bracket provides a block or gate name with the pin or port name that is to coupled to the net ctl_13. The last bracket includes a dot (".") to refer to the top level ports of the st_mux_opto_1 design. The first number in each bracket represents a load that may be applied to the net by the pin. The ctl 1 signal has a load of one that is applied to ctl_13. The last number represents a bit number of a bus if the signal to be coupled is part of a bus. If the signal is not part of a bus, the default value is zero. Bit 2 of the control input of mux6 is to coupled to the net ctl_13. Command lines 1202C, net ("n") commands, are netlist generation commands.

Command line 1258 is a design extras command that may set internal counter values of a design to correct initial values. This is transparent to a user.

Command line 1260 is a netlist extras command that may set the effort level that the IC design program is to apply to the design. Using numerals, the effort level may be set to a high effort level, a medium effort level, or a low effort level in performing work on the IC design.

Command lines 1230C, a popd command, assures that we are now referencing the st_mux_opto_1 block at its top level for the next command line.

Command line 1265 is the command that causes the master process to find the block with its old netlist that it has associated with the current TCL channel and replace it with the new netlist that it has received over the TCL communication channel. In this case, the master process keeps track of which blocks are being worked upon across each TCL channel. In another embodiment of the invention, the slave process may send the block name it has worked upon to the master process so it doesn't need to track the block names.

Figure 13:
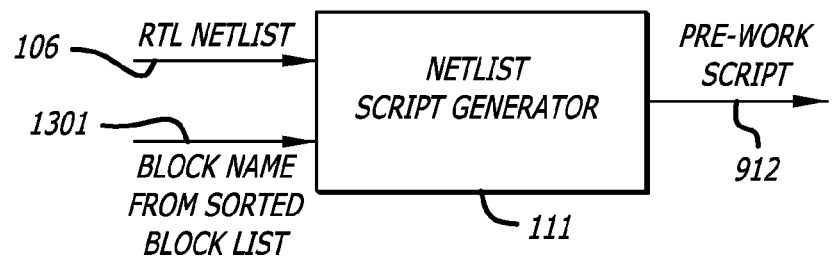
FIG. 13 is a block diagram of a netlist script generator.
Figure 19:
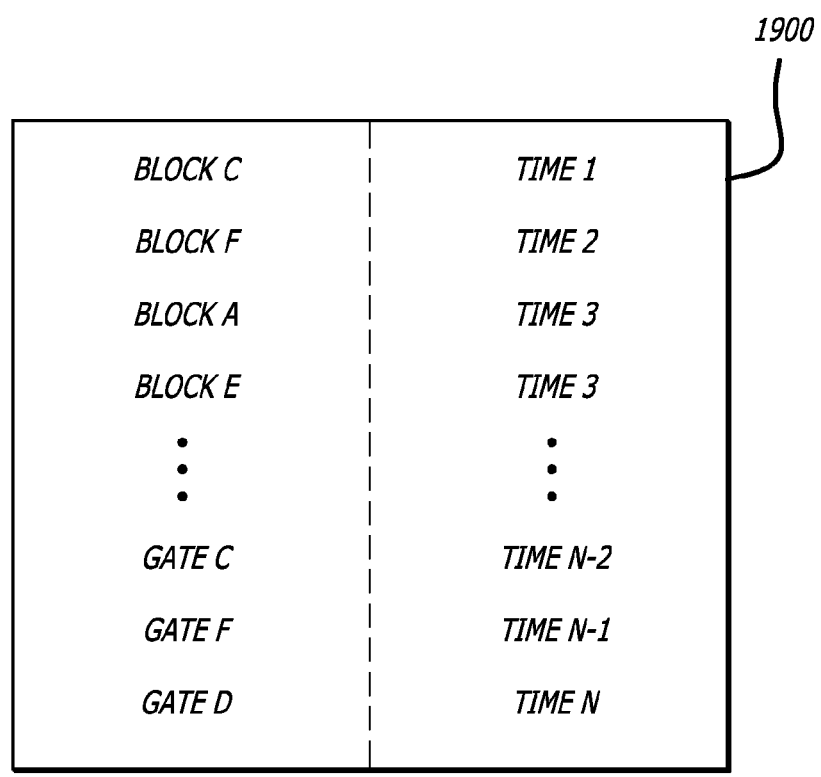
FIG. 19 is an exemplary sorted block name listing annotated with completion times.

Referring now to FIG. 13, a block diagram of the netlist script generator 111 is illustrated. The netlist script generator receives the RTL netlist 106 and a block name 1301 upon which work is to be performed from a sorted block name list 1900, such as illustrated in FIG. 19. The script generator 111 generates the commands of the pre work script 912 including the netlist commands describing the netlist portion upon which work is to be performed in a command line format. The netlist commands are described in greater detail with reference to FIGS. 2, 3, and 11-12. In one embodiment of the invention, the pre work script file 912 is generated in a TCL format. In which case, the script generator 111 automatically generates the commands in TCL format for use over the TCL communication channels.

Figure 14B:
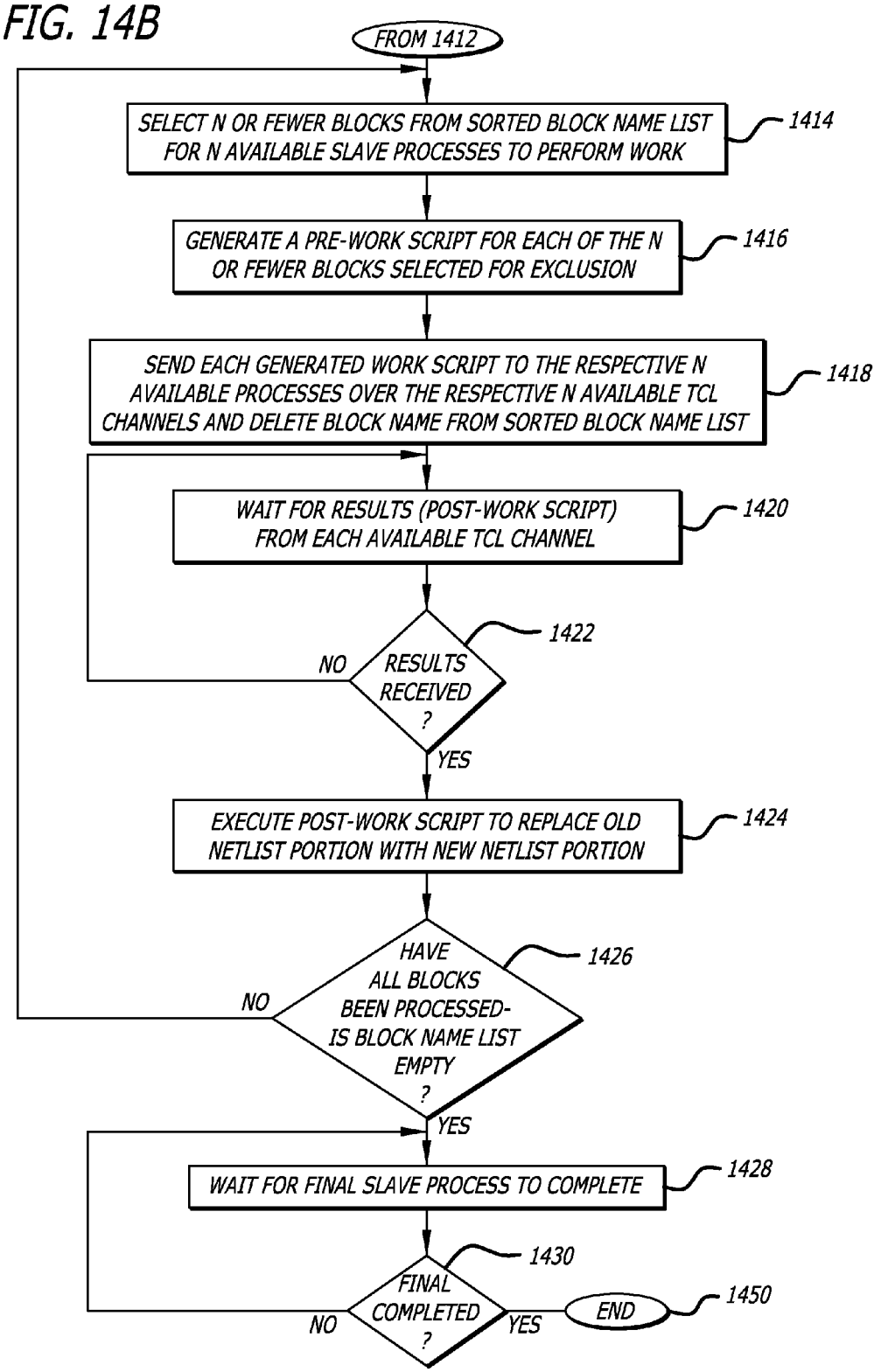

Referring now to FIGS. 14A-14B, a method of the master process for super-threading is now illustrated. The process starts at process symbol 1400 and then goes to process symbol 1401.

At process symbol 1401, a user's RTL netlist or HDL of the IC design is loaded.

Next at process symbol 1402, the users hierarchy is read from the RTL netlist to generate a list of block names. In one embodiment of the invention, the list of block names from the user's hierarchy is used to partition the work to be performed on the IC design over one or more pre-work scripts.

Referring now to FIG. 19, an exemplary sorted block name listing 1900 is illustrated annotated with expected completion times. In the left column are the block names of the IC design (e.g., Block C, Block F, etc.) that are used to name the work scripts. In the right column are the respective estimated times to completion (e.g., Time 1, Time 2, etc.) for the IC design program to perform work on the respective block.

Referring now back to FIG. 14A, at the next process symbol 1404 a determination is made as to whether super-threading is enabled or not. If super-threading is not enabled, the method goes to process symbol 1408. If super-threading is enabled, the process goes to process symbol 1406.

At process symbol 1408 with super-threading disabled, a fake TCL communication channel 906 is opened which is also referred to as a bounce channel. The fake TCL communication channel 906 allows the master process 900 to communicate work scripts back to itself, as illustrated in FIG. 9A. The process then goes to process symbol 1410.

At process symbol 1406 with super-threading enabled, a remote program execution command or a job queuing system is invoked so that TCL communications channels 904A-904N between the master process 900 and slave process 901A-901N can be formed. The job queuing system may be provided by a load sharing facility or a server farm.

Next at process symbol 1407, true TCL communication channels 904A-904N are opened for each available slave process 901A-901N that was invoked by the earlier process of process symbol 1406. Thus, referring back to FIG. 9A, the TCL channels 904A-904N between the master process 901 and the slave processes 901A through 901N are opened.

Next at process symbol 1409 with super-threading enabled, the master process sends global configuration commands to all of the available slave processes over all the TCL channels. The global configuration commands include a command to load the technology library, such as a standard cell library, that is being used by the master process. If super-threading is disabled and the bounce channel is being used, the technology library has already been loaded by the master process and thus no need to send over the fake TCL channel.

At process symbol 1410, the process merges and the time to complete work on each block name by the IC design program is estimated and added to the block name list 1900 as illustrated in FIG. 19.

Next at process symbol 1412, the block name list 1900 is sorted in order in response to the estimated completion times. FIG. 19 is illustrated as being sorted in order such that Time 1 is the longest estimated completion time and Time N is the shortest estimated completion time.

Now referring to FIG. 14B at process symbol 1414, N or fewer blocks are selected from the sorted block name list 1900 for N available slave processes to perform work. For example, there may be only three slave processes available to perform work for ten block names listed on the sorted block name list 1900. In this exemplary case, three block names are selected from the sorted block name list 1900 for the IC design program to perform work on the IC design using three slave processes.

Next at process symbol 1416, a pre work script is generated by the netlist script generator 111 for each of the N or fewer blocks selected from the sorted block name list 1900.

Then as the commands for each pre-work script are generated, they are sent out to the respective available slave processes over their respective TCL communication channels at process symbol 1418. The row entries with the block names associated with the selected N or fewer selected blocks are then deleted from the sorted block name list 1900 illustrated in FIG. 19. Deleting the row entries indicates the IC design program has begun to work on the netlist associated with those block names and should be completed.

Next at process symbol 1420, the master process waits for the results, the post work script communication, from the available TCL channels associated with the available slave processes.

Then at process symbol 1422, a determination is made as to whether any results have been received over the available TCL channels. If not, the method loops back around to process symbol 1420 where the master process continues to wait for results over the TCL channel from the slave processes. If results are received, the method jumps to process symbol 1424.

At process symbol 1424, the commands of the post work script are executed by the master process including commands to replace the old netlist portion with the new netlist portion from the results. The process then goes to process symbol 1426.

At process symbol 1426, a determination is made if all blocks have been processed. The sorted block name list 1900 may be checked to see if it is empty. If there are blocks remaining on the sorted block name list 1900, the process loops back to process symbol 1414 where a different set of N or fewer blocks are selected from the block name list for the N available slave processes. It may be the case that there are fewer blocks on the netlist then slave processes available, in which case the remaining blocks on the block name list 1900 are processed. If the sorted block name list 1900 is empty, the process goes to process symbol 1428.

At process symbol 1428, the master process waits for final slave processes to complete their work and send their results back over the TCL channels. The results are communicated to the master process by the post-work script.

Next at process symbol 1430, a determination is made if the final slave processes have been completed. If not, the method loops around back to process symbol 1428 and continues to wait for the final slave processes to complete their work and send the results. If it is determined that all the slave processes have completed their final work scripts, the process jumps to process symbol 1450 and ends.

Figure 15:
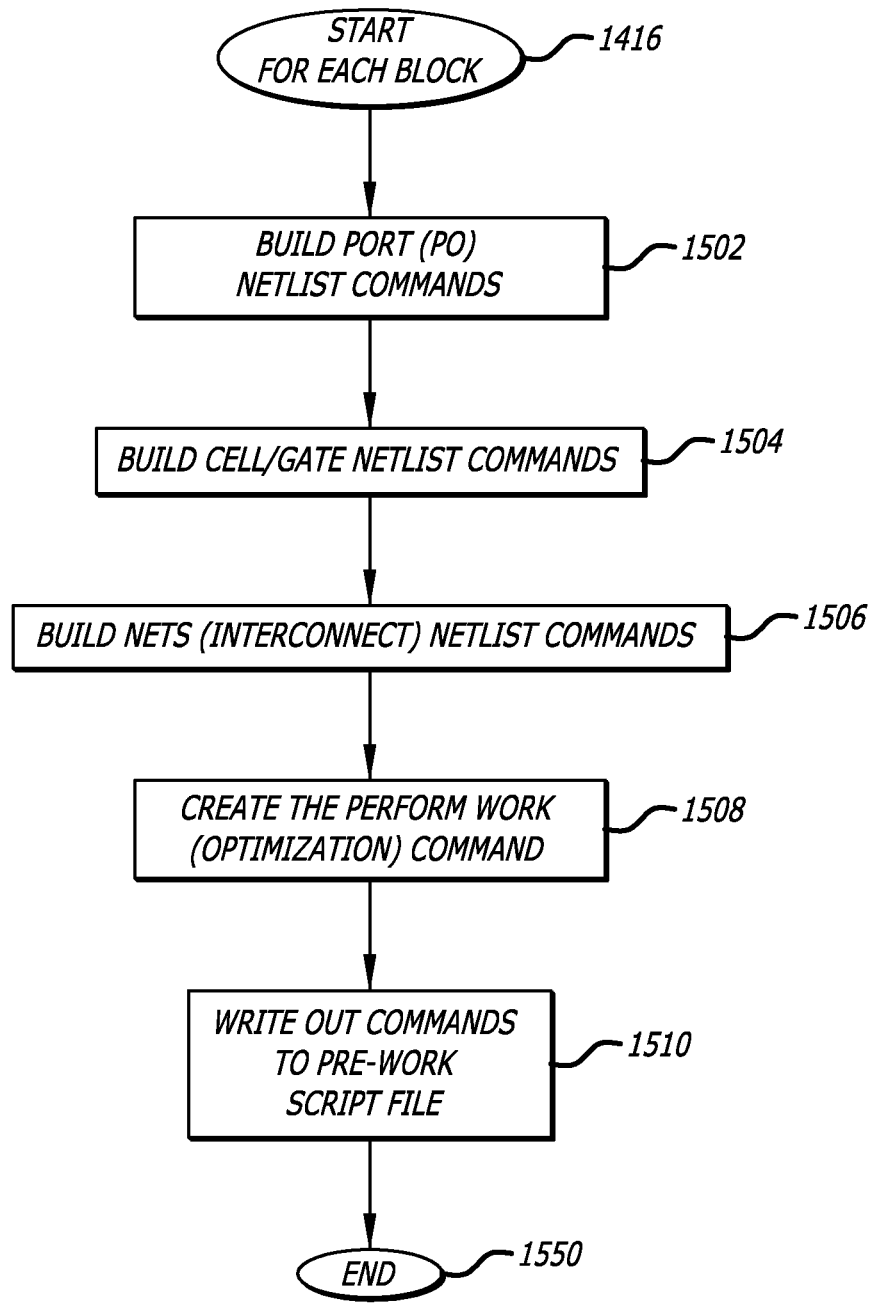
FIG. 15 is a flow chart of a method of generating commands for a work script.

Referring now to FIG. 15, a method of generating the pre work script by the netlist script generator 111 is illustrated. The method starts at process symbol 1416 and jumps to process symbol 1502. In a preferred embodiment of the invention, the commands are written in a TCL format.

At process symbol 1502, the port netlist commands (P0) are generated for the given block name. This is the listing of the input and output port names for the portion of the netlist being worked on.

Next at process symbol 1504, the sub-block and gate netlist commands are created for each sub-block and gate of the users IC design hierarchy.

Next at process symbol 1506, the net commands are created describing the interconnections between sub-blocks, gates, and input and output ports.

Next at process symbol 1508, a perform work command is created. In one embodiment of the invention the perform work command is an optimization command to perform one of a variety of optimizations on an IC design, such as area or timing optimization.

Next at process symbol 1510, the commands generated by process symbols 1502, 1504, 1506, and 1508, are written out as a pre work script.

With all the commands written out into the TCL channel for the pre-work script, the method can end for that one pre-work script at process symbol 1550.

As discussed previously, the pre-work script is sent over a TCL communication channel by the master process to a slave process, such as a remote slave process or a local slave process. Each TCL communication channel is set up by the master process.

To set up a TCL channel with a slave process, the master process causes another copy of the IC design program (such as an optimization or synthesis program) to be launched on the appropriate computer system for the available slave process. If a local slave process, another copy of the IC design program is launched so that it can be executing on the master computer. If a remote slave process, a copy of the IC design program is launched on the slave computer system so that it can be executed with the remote slave process. As part of the launching process, a master IP address and a communication port number is provided to the slave process so that it knows where the master process is waiting for the slave process to communicate back and open a TCL channel. The IP address may vary depending upon whether the slave process is remote on a local area network or a wide area network. When the slave process answers back to the master process at the master IP address and the communication port number indicating it is ready to perform work, the master process acknowledges the slave process that the TCL communication channel is opened between the master process and the slave process.

Assuming that the TCL communication channel is open, the slave process watches for commands over the TCL channel from the master process. When the slave process receives a command from the TCL channel, it executes that command. For example, the slave process waits for an exit command from the master process to exit the IC design program and close its end of the TCL channel. The master process closes its end of the TCL channel. The slave process also waits for a pre-work script to be sent by the master process over the TCL channel.

Figure 20:
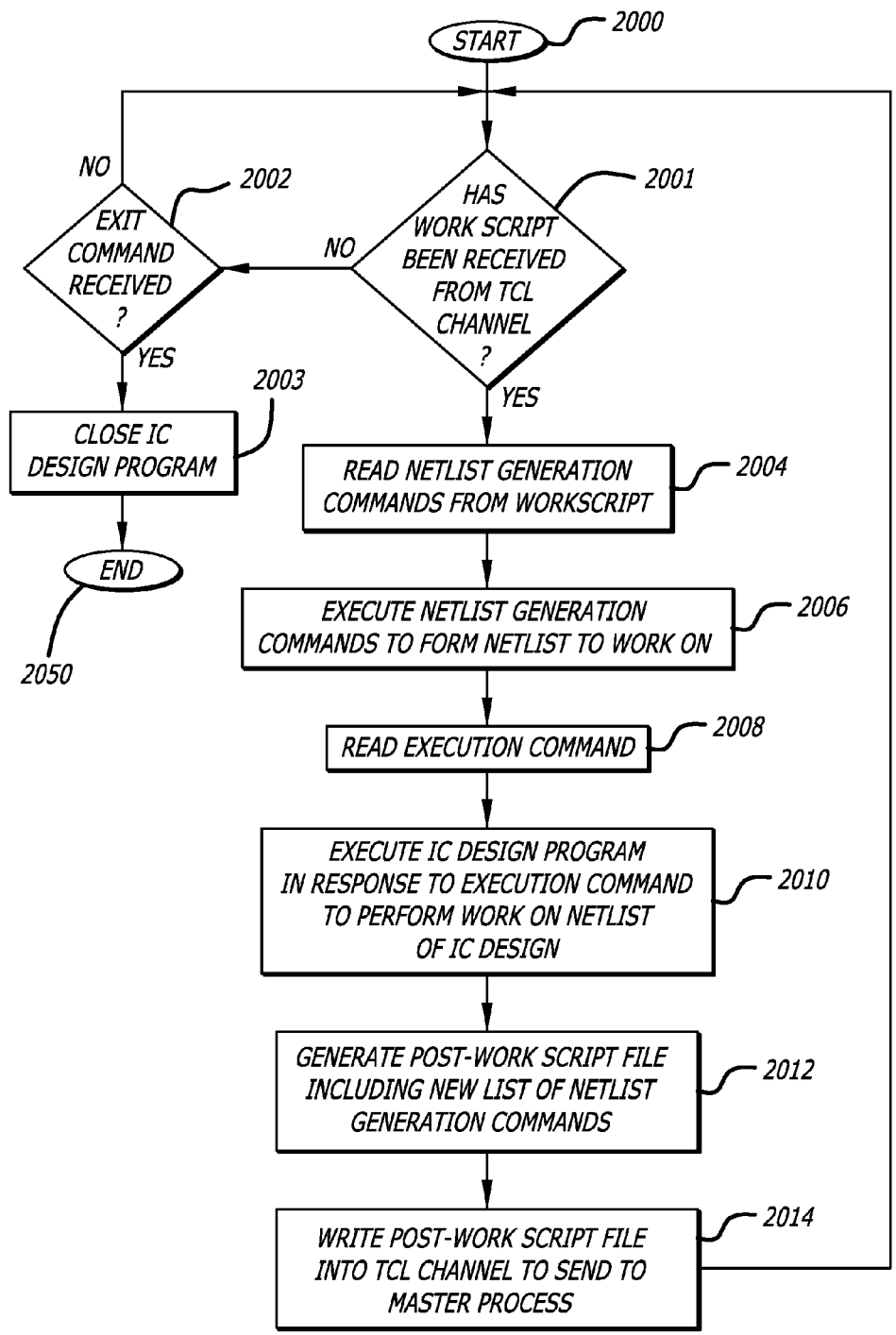
FIG. 20 is a flow chart of a method of a slave process to support super-threading.

Referring now to FIG. 20, a method of a slave process for super-threading is illustrated. The method starts at process symbol 2000 and then goes to process symbol 2001.

At process symbol 2001, a determination is made if a command for a work script has been received over the TCL channel. If not, the process begins to loop back around waiting for a command of a pre-work script or an exit command from the master process by going to process symbol 2002. If commands of a work script are being received, the process goes to process symbol 2004.

At process symbol 2002, a determination is made if an exit command has been received. If an exit command is received, the process goes to symbol 2003 where the IC design program is closed to free up resources on the computer system or server and then ends at process symbol 2050. If no exit command is received, the process loops back around to symbol 2001 to determine if a command of work script has been received.

When a pre-work script with its netlist commands is sent over the TCL channel to the slave process, the slave process may coincidentally execute the commands of the pre-work script without waiting for others. That is, if a TCL command is available on the TCL channel the slave process executes it. If another TCL command becomes available on the TCL channel it is executed without waiting to receive a complete set of command forming a pre-work script. The slave may execute the sequence of TCL commands in order as they are sent by the master process sends it. Other commands may be sent in the sequence to the slave and executed that are not a part of a pre-work script.

The netlist generation commands are executed to build up a representation of the netlist that the slave is to perform work on. Other commands are also executed by the pre-work script by the slave process depending upon the IC design tool and the work that is to be performed.

At process symbol 2004, the netlist generation commands of the pre-work script are read from the TCL channel. The netlist generation commands were described in detail with reference to FIGS. 2 and 3.

Next at process symbol 2006, the netlist generation commands are executed by the slave process to form a netlist upon which work is to be performed by the IC design program.

Then at process symbol 2008, the IC design program is executed in response to the execution command to perform work on the netlist of the IC design or portion thereof that was formed in process symbol 2006. The final command of the pre-work script is executed by the slave process to cause the IC design program to perform work on the netlist.

When the slave process is finished performing the work on the netlist generated by the pre-work script, the slave process generates a post-work script (the "results") that is communicated back over the same TCL channel to the master process.

Next at process symbol 2012, the slave process generates the post-work script that is communicated over the TCL channel. The post-work script is generated by the slave process in a somewhat similar manner to how the pre-work process is generated. In one embodiment of the invention, the slave process performs logic optimization on that netlist and writes an optimized netlist in command format over the TCL channel as the post-work script.

Then at process symbol 2014, the post-work script is written into the TCL communication channel to send to the master process. Once the post-work script has completely been sent over the TCL channel by the slave process, it waits for other commands to come from the master process over the TCL channel. The process loops back to process symbol 2001 to determine if another pre-work script is to be sent.

Debug Work Script File Generation

In the case of a program fault in the IC design program, a signal handling routine is executed to write out the debug work script file. An exemplary signal handling routine written in pseudocode is as follows:
global_string_variable current_block_name=NULL;
function normal_signal_handler( ){
/* just dump out the stack trace of where we are now */
dump_current_stack_trace( );
}
function advanced_signal_handler( ){
/* first dump the stack trace like we usually do */
normal_signal_handler( );
/* now write out the script we are currently executing to a file */
block=find_block_by_name(current_block_name);
write_script_for_block_to_file(block, "./debug_script");
print("Please send the file ./debug_script to Software Developer's R&D to help us diagnose and fix this most-unfortunate problem.");
}
/* change signal handler to dump the script */
current_block_name=this_block_name;
change_signal_handler(advanced_signal_handler);
/* now if a signal is received we will write the script */
/* now execute this one script
block=find_block_by_name(this_block_name);
execute_script_for_block(block);
/* revert the signal handler to its original state */
current_block_name=NULL;
change_signal_handler(normal_signal_handler);
/* now if a signal is received we will only dump the stack trace */

Figure 4:
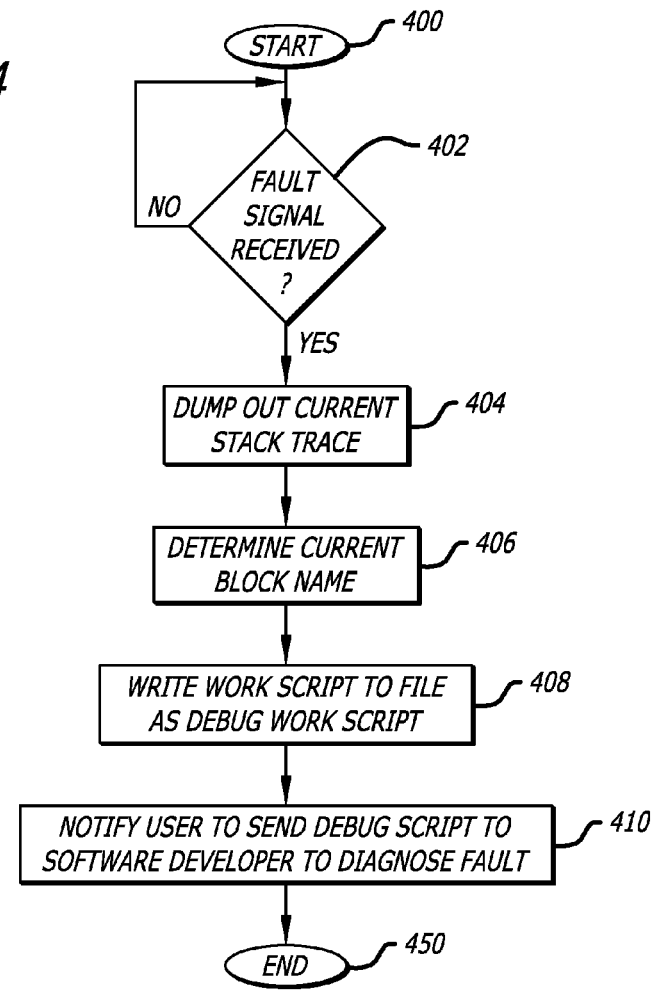

Referring now to FIG. 4, a flow chart illustrates an exemplary method of generating a debug work script file in the case of a fault in the IC design program similar to the signal handling routine described previously in pseudocode. The method begins at process symbol 400 jumping to process symbol 402.

At process symbol 402, a determination is made as to whether or not a fault signal has been received. If not, the method loops around process symbol 402 waiting for a fault signal to be received. If a fault signal has been received, the method goes to process symbol 404.

The fault signal is generated by the operating system indicating that the IC design program had a program fault and went fatal, for example. In UNIX or LINUX, a possible fault signal includes one or more of a segmentation violation ("SIGSEGV"), a floating point exception ("SIGFPE"), an illegal instruction ("SIGILL"), and/or bus error ("SIGBUS").

A command, such as the UNIX command sigaction, is given the operating system to instruct it to save dump out the current stack trace and the work script having a fault into a file as the debug work script file, if one or more fault signals are received. The command may point to signal handling process to indirectly instruct the operating system to save the current stack and debug work script file as well as perform other housekeeping chores upon program fault.

At process symbol 404, the process dumps out the current stack trace into a file as the debug stack trace 114. Generally a stack trace, such as the debug stack trace 114, aids in debugging program errors and/or program faults by indicating where the error and/or faults occur during execution of a program.

At process symbol 406, the name of the current block being worked upon for which the fault occurred is determined. The block name may be equivalent to the work script name.

At process symbol 408, the work script that was executed to generate the program fault is found in memory or recreated and written out into non-volatile storage as the debug work script file 113. If the work script was being executed remotely by a remote or slave computer system, the debug stack trace 114 and debug work script file 113 would be dumped out to a different computer coupled to the network 140, such as the master computer 100B. Alternatively, the debug stack trace 114 and debug work script file 113 could be directly written into a hard drive coupled to the master computer 100B or a networked attached storage device associated with the master computer 100B. The debug stack trace 114 and debug work script file 113 are written into non-volatile storage as the IC design program is terminated upon program fault and the operating system may free up the memory previously being used by the program for other uses. After writing the debug stack trace 114 and debug work script file 113, the process then goes to process symbol 410.

At process symbol 410, the user is notified that a program fault has occurred and that he should send the debug work script file (and the debug stack trace 114) to the software developer to diagnose the program fault. The process then goes to process symbol 450.

At process symbol 450, the fault signal handling process and the method of generating the debug work script file ends.

Figure 5:
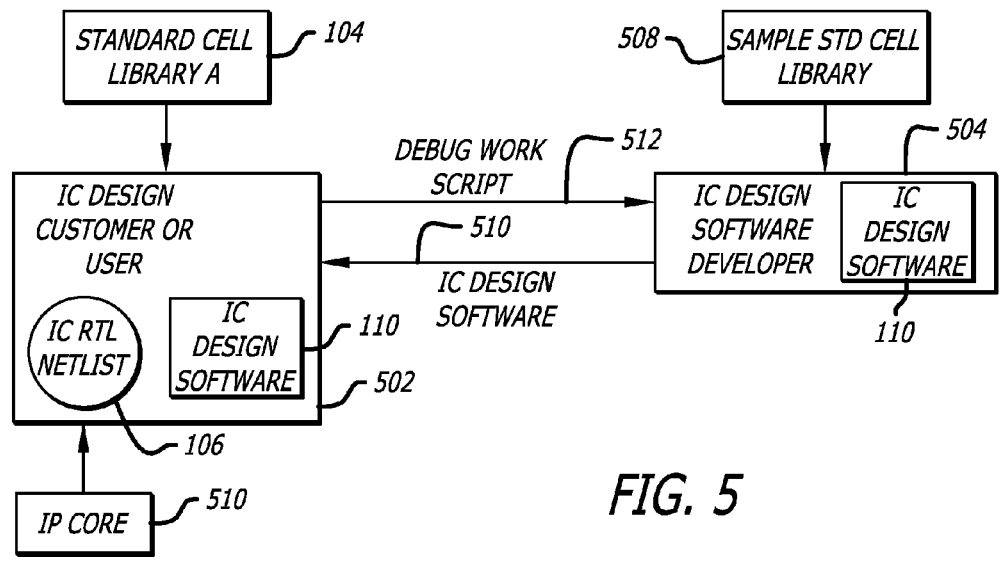

Referring now to FIG. 5, a block diagram illustrates the information flow between a customer/user 502 and an IC design software developer/programmer 504, including the debug work script file 113, to debug IC design software. The IC design customer/user 502 purchases a license to use a copy of the IC design software 110 to perform work on the IC design 150. The software developer 504 transmits a license key and a copy of the IC design software 110 to the customer/user 502 or allows the customer/user to download the license key and the copy of the IC design software 110 as indicated by arrow 510. The license key allows the IC design software 110 to be executed and may restrict execution of the IC design software to certain licensing conditions.

The customer/user 502 may have developed the standard cell library 104 or purchased it from a third party, such as a standard cell library vendor, that may be used with the IC design software 110 to perform work on the IC design 150. The IC design software 110 may use the RTL netlist 106 representation of the IC design 150 to perform work thereon. The customer/user 502 may further purchase an intellectual property core functional block (e.g., a processor) from a third party, such as IP block vendor, to be included as part of the IC design 150 that may be used with the IC design software 110 to perform work thereon.

In the case of a program fault, the customer/user 502 sends at least the debug work script file 113 saved in non-volatile storage 102 to the software developer 504 for debugging as indicated by the arrow 512. The customer/user may also transmit the current stack trace 114 to the software developer for debugging. The customer/user 502 may optionally transmit the standard cell library 104 to the software developer 504 but may be reluctant to do so, particularly if purchased from a third party. In this case, the software developer 504 may use its own standard cell library 508 as a substitute for the customer/user's standard cell library in debugging the IC design program 110.

Figure 6:
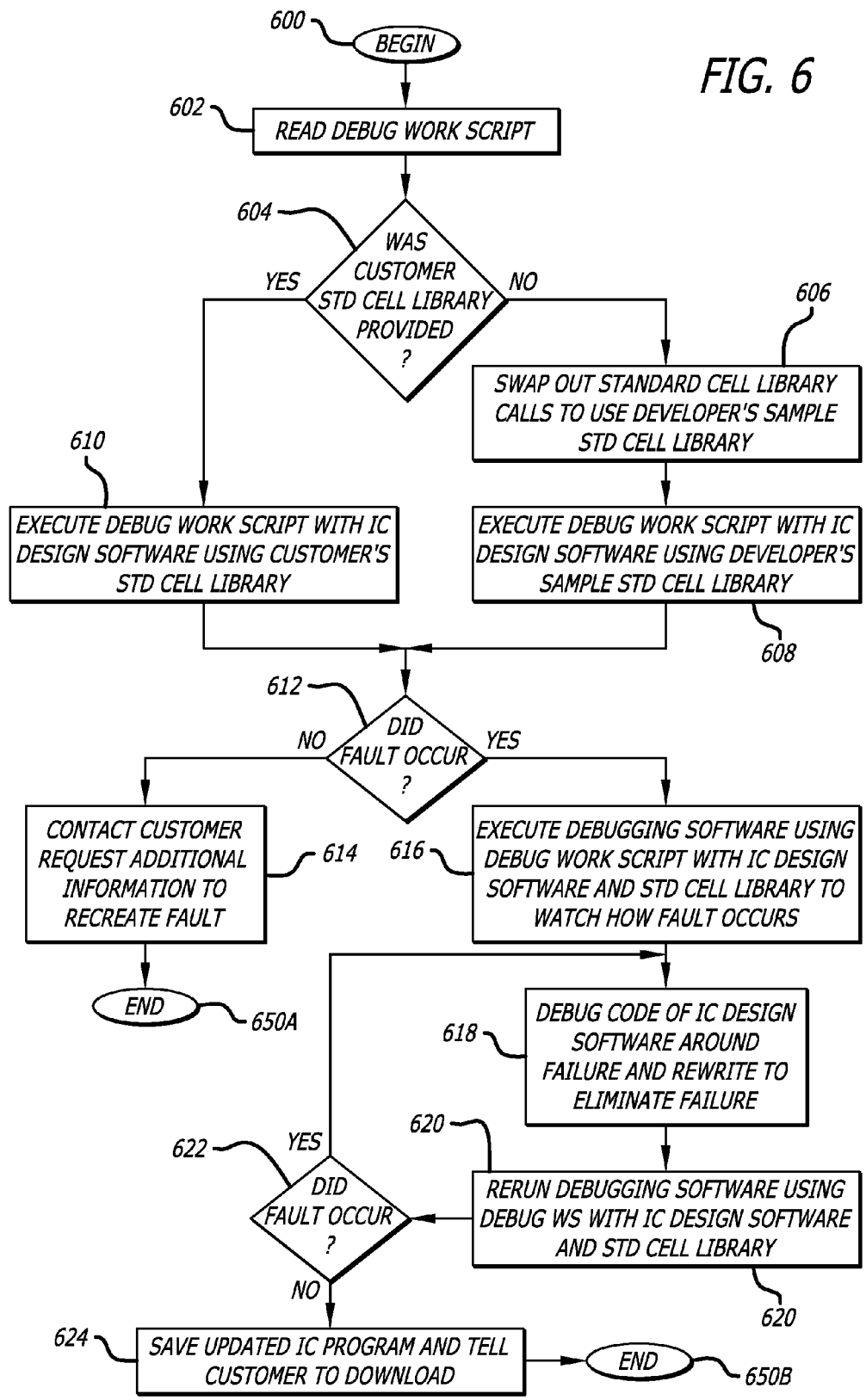

Referring now to FIG. 6, a flow chart illustrating a method of debugging a fault in an IC design program using a debug work script file is illustrated. The debug work script file reduces the information needed from a customer/user so that a software developer/programmer can debug an IC design program. The method begins at process symbol 600 jumping to process symbol 602.

At process symbol 602, the debug work script file is read into a computer system.

At process symbol 604, a determination may be made as to whether or not the user also supplied his standard cell library to debug the IC design program. If so, the method goes to process symbol 610 and the debug work script file can be executed as is with the user's standard cell library and the process then goes to process symbol 612. If not, the method goes to process symbol 606.

At process symbol 606, the debug work script file is edited to swap out the calls to the user's standard cell library with the developer's sample standard cell library. As discussed previously, the developer's sample standard cell library may be sufficient to debug the program fault in the IC design program when executing the debug work script file.

At process symbol 608 after editing the debug work script file, the edited debug work script file can be executed with the IC design program using the developer's work script and the process then goes to process symbol 612.

At process symbol 612, a determination is made as to whether or not a fault occurred during execution of the debug work script file with the IC design program and respective standard cell library. If not, the process goes to process symbol 614 and the user is asked for further information regarding the program fault and the conditions that led up to the program fault in order to try and recreate it, and the process then ends at 650A. If the fault occurs during execution of the debug script, the process goes to process symbol 616.

At process symbol 616, debugging software is executed to watch how the fault occurs. The debugging software is executed with the IC design software and the respective standard cell library using the debug work script file. The debugging software allows program execution to be stepped line by line or command by command to the point of the program fault. Once it is determined how the program fault occurs, the process goes to process symbol 618.

At process symbol 618, the program code of the IC design program is debugged around the program fault and rewritten in an attempt to avoid the program fault. After debug and rewriting the code, the IC design program can be compiled and rerun with the debugger.

At process symbol 620, the debugging software is rerun with the rewritten IC design software and the respective standard cell library using the debug work script file.

Then at process symbol 622, a determination is made as to whether or not a fault occurred during execution of the debug work script file with the rewritten IC design program and the respective standard cell library. If a fault does occur, the process goes back to process symbol 618 where the program code of the IC design program is debugged once again around the given program fault and rewritten once again to try to avoid the program fault. If no further fault occurs, the process goes to process symbol 624.

At process symbol 624, the updated IC program is sent to the user or saved to a location with an explanation to the customer as to how to download the updated software. The process then ends at process symbol 650B.

Figure 7:
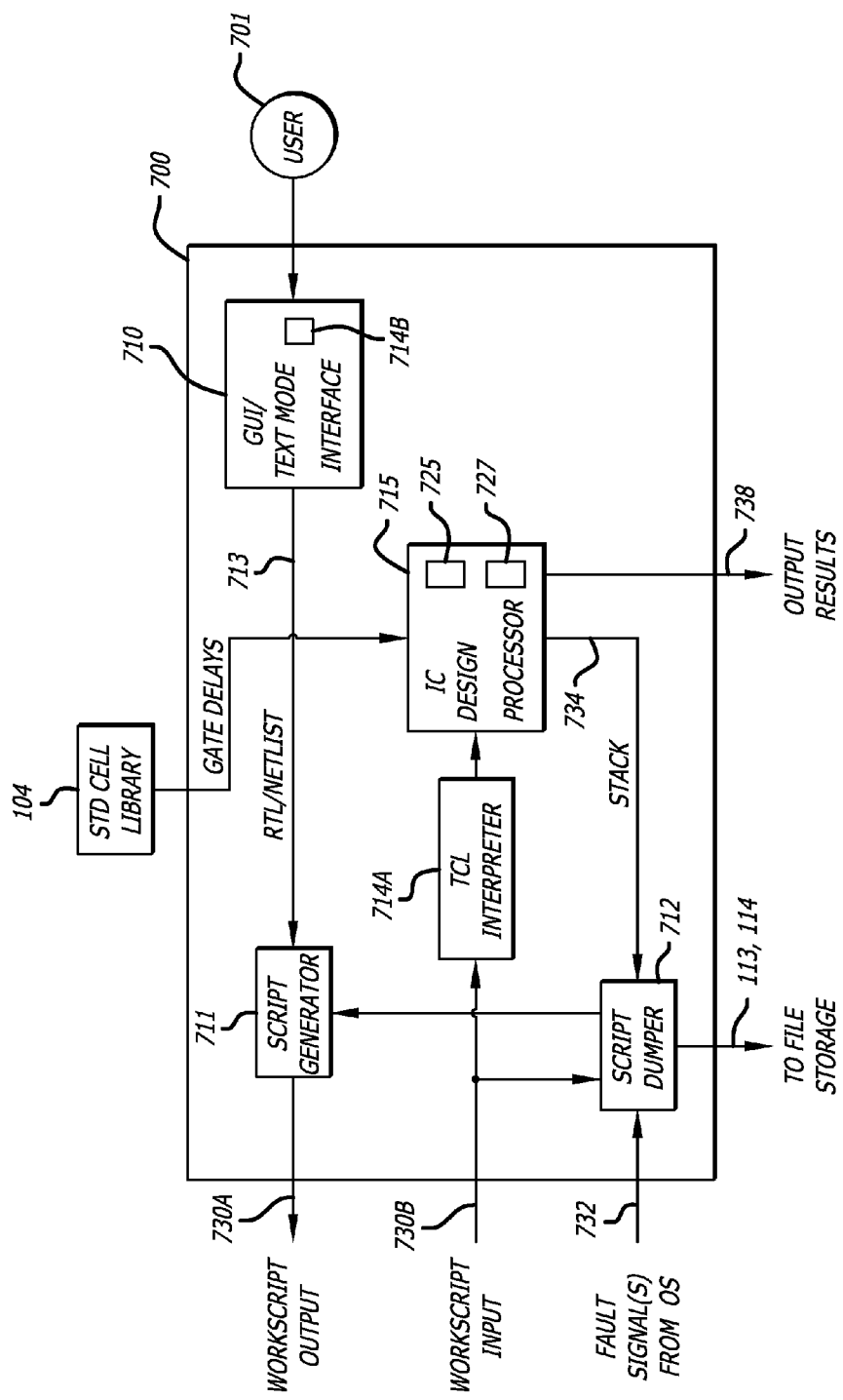
FIG. 7 is a functional block diagram of an IC design program to generate the work scripts for execution by one or more computers and to write out the debug work script file in case of a fault.

Referring now to FIG. 7, an exemplary block diagram is illustrated of software modules of an IC design program or tool 700 embodying the invention. The IC design program or tool 700 may be any one or more of the various IC design tools discussed with reference to FIG. 8 that perform work on an integrated circuit design. The IC design program 700 generates one or more work scripts 130A-130N for execution by one or more computer systems 100A, 100B, 101A-101N and writes out a debug work script file 113 in response to a program fault. The IC design program 700 may also cause the current stack trace 114 to be written in response to a program fault.

In one embodiment of the invention, the IC design tool 700 is a logic synthesizer that is used to perform logic synthesis of functional blocks in the integrated circuit design 150.

The IC design program 700 includes software modules of a graphical user interface (GUI) or a text mode interface 710, a script generator 711, a script dumper 712, and an IC design processor 715 coupled together as shown in FIG. 7. The IC design program 700, which may also be referred to as an IC design tool, an electronic design automation (EDA) tool or an electronic computer aided design (ECAD) tool.

The IC design program 700 may receive user inputs from a user 701 and a standard cell technology library 104 in order to perform work on the functional blocks of the integrated circuit design. The IC design program 700 includes a graphical user interface (GUI) or a text mode interface 710 for receiving inputs from the user 701 in the form of a register transfer level (RTL) description (for example, Verilog, VHDL, System-Verilog, System-C, etc.), an RTL netlist 713 of one or more functional blocks, or all functional blocks of the integrated circuit.

The input RTL/Netlist 713 describing the functional blocks/integrated circuit is coupled into the script generator 711. The script generator 711 generates the one or more work scripts 130A-130N at the program output 730A in response thereto.

To read a work script 130A-130N on the work script input port 730B, the IC design program 700 may include a TCL interpreter 714A to interpret a work script. The TCL interpreter 714A may be coupled between the work script input port 730B and the IC design processor 715. Alternatively, the text mode interface 710 includes a TCL interpreter 714B that may be used to read and interpret a work script.

If there is no program fault, the resultant output 738 from the IC design processor 715 of the IC design program 700 may be a logical netlist 108 that is a more refined or optimized netlist from that of the RTL netlist 713. The IC design processor 715 may include an optimizer 725 and a delay computation unit 727 in one embodiment of the invention to generate the logical netlist 108 as the output results 738. The delay computation unit 727 computes expected signal delays/arrival times through one or more functional blocks of the integrated circuit 150. The delay computation unit 727 receives gate delay information 724 from the technology library of the standard cell library 104 to compute the expected delays and/or arrival times of signals. The optimizer 725 includes algorithms to optimize the logic of the one or more functional blocks of the integrated circuit in response to the constraints found within the work script and the expected delays and/or arrival times of signals that are computed by the delay computation unit 727.

If there is a program fault, as indicated by one or more fault signals 732 from the operating system, the script dumper 712 writes out the debug work script file 113 and may also write out the current stack information as the debug stack trace 114. To do so, the script dumper 712 receives one or more work scripts 130A-130N from the program input 730B and the current stack information 734 from the IC design processor 715. The script dumper 712 also receives the one or more fault signals 732 from the operating system in order to determine which work script to write out as the debug work script file. That is, the script dumper 712 is responsive to the one or more fault signals 732 to cause one of the work scripts 130A-130N to be written out as the debug work script file 113. In one embodiment of the invention, the script dumper 712 asks the script generator 711 to regenerate the script which caused the program fault and dumps it to a file as the debug work script file.

Debug Logging

While writing out a debug work script file is very useful to debug a program fault, there may be other errors that occur, such as during super-threading and the communication of the work scripts. In which case, it may be desirable to log all work script communication over all of the TCL communication channels.

Referring momentarily to FIG. 9A, one or more standard TCL communication channels 904A-904N are illustrated for communicating work scripts between the master process 900 and the one or more slave processes 901A-901N. In a debug logging mode, a custom TCL communication channel may be momentarily formed each time that work scripts or other commands or messages are to be communicated between the master process 900 and the slave processes 901A-901N such that they are also communicated to a debug directory and saved as log files in the non-volatile storage 102. Besides work scripts, other commands or messages that may be communicated may be an error message for example. After the work script, command, or message is communicated and the log file is closed, the standard TCL communication channel can be restored. This is so each work script written and message is logged into its own logged work script file to avoid having to determine where one work script starts and ends and the next work script begins.

Figure 18:
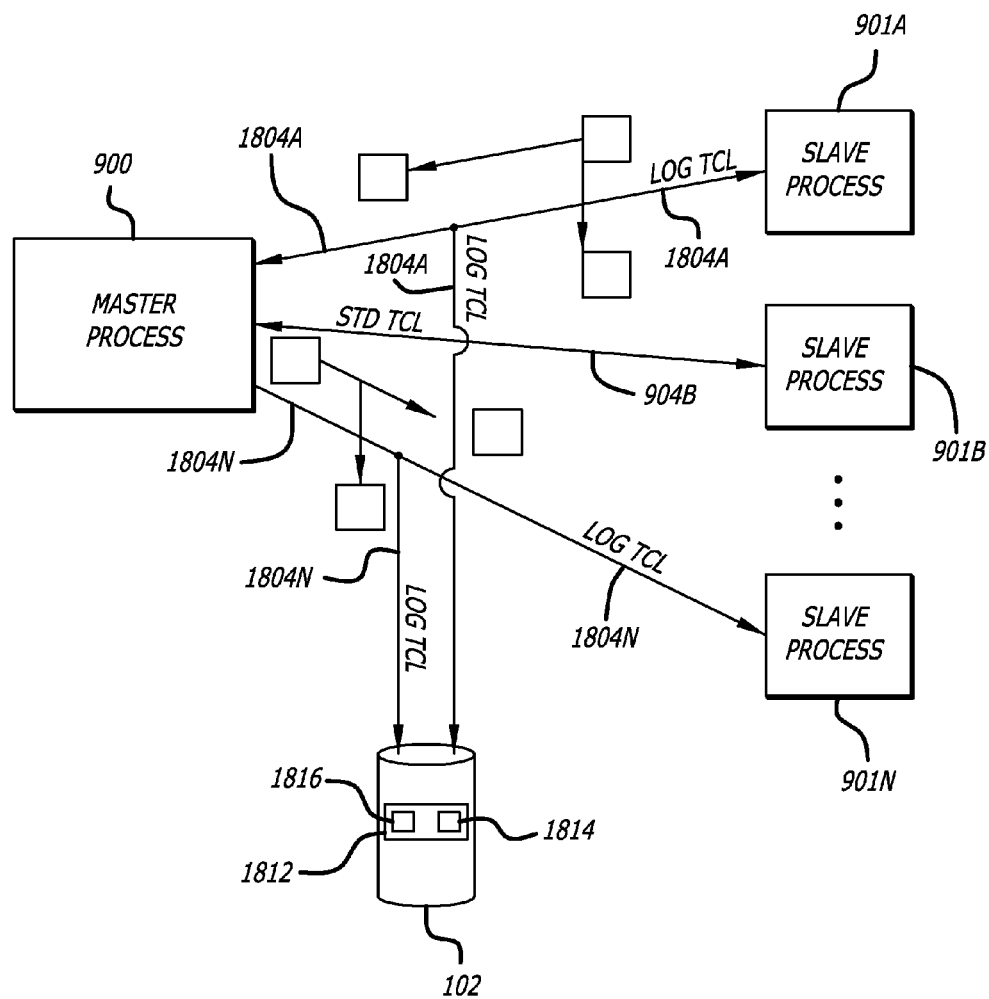
FIG. 18 is a block diagram of debug logging of communication between a master process and one or more slave processes into a debug directory.

Referring now to FIG. 18, one or more logging TCL communication channels 1804A-1804N have been formed between the master process 900 and one or more of the slave processes 901A-901N and into a debug directory 1812 of the non-volatile storage 102. A logging TCL communication channel 1804A is formed by and between the master process 900, the slave process 901A, and the debug directory 1812 such that any communication is also logged into the debug directory 1812 in a file system provided by the non-volatile storage 102. The slave process 901A is ready to send the sequence of commands of a post work script over the logging TCL communication channel 1804A. Upon doing so, the sequence of commands of the post work script are sent to both the master process 900 and the debug directory 1812 and written into therein as a logged post work script file 1814 on the non-volatile storage 102. A pair of sub-directories in the debug directory may be used to distinguish between pre-work scripts files and post-work scripts files. For example, an outgoing sub-directory may be used to store the logged pre-work scripts files. An incoming sub-directory may be used to store the logged post-work script files.

A standard TCL communication channel 904B is maintained between the master process 900 and the slave process 901B without a connection to the debug directory 1812 as no work script is ready to be sent. If in a debug logging mode and a work script, command, or message is ready to send over the standard TCL communication channel 904B, it is swapped with a logging TCL communication channel before the work script is written into any TCL communication channel. Some simple communication between the master process and the slave processes over the TCL channels may not be logged, such as an exit command that causes the slave process to quit.

Another logging TCL communication channel 1804N is formed between the master process 900, the slave process 901N, and the debug directory 1812 so that a pre work script can be sent by the master process 900. The commands of the pre-work script are sent to the slave process 901N and the debug directory 1812 and written into therein as a logged pre-work script file 1816 on the non-volatile storage 102.

After the work script is sent and logged into the debug directory, the logging TCL communication channel can be removed and the standard TCL channel 904A-904N can be restored between the master and slave processes as illustrated in FIG. 9A.

Referring now to FIG. 17, a method of debug logging work scripts over TCL channels is illustrated. The method starts at process symbol 1700 and goes to process symbol 1702.

At process symbol 1702, a determination is made as to whether or not a work script is ready to send over a TCL channel. The work script that is to be sent over the TCL channel may be a pre-work script or a post-work script. If a work script is not ready to send, the process loops back around and continues to wait for a work script that is ready to be sent over a TCL channel. If a work script is ready to be sent, the process goes to decision process symbol 1704.

At decision process symbol 1704, a determination is made if the debugging mode is enabled. If not, the process goes to process symbol 1706. However if debugging mode is enabled, the process goes to process symbol 1708.

At process symbol 1706, debugging mode is disabled and the work script is written over a standard TCL channel. The process then goes to process symbol 1750 and ends.

At process symbol 1708, debugging mode is enabled and a log file is opened in a debug directory on the file system using the current block name. The process then goes to process symbol 1710.

At process symbol 1710 the standard TCL channel is saved and replaced with a logging TCL communication channel. The logging TCL communication channel acts like a splitter, allowing a work script to be written to the destination of the standard TCL channel as well as into the log file opened in the debug directory.

Next at process symbol 1712, the work script is written over the current logging TCL communication channel. The work script is written over the TCL communication channel between the slave process and the master process and into a log file in the debug directory on the file system.

Next at process symbol 1714, the log file in the debug directory is closed with the current block name. This is useful in that separate log files are made for every work script being transmitted over the TCL communication channel instead of one large log file. That is, the debug directory may contain a plurality of individual log files for every work script transmitted over the TCL communication channel between master process and slave process.

Then at process symbol 1716, the logging TCL channel is removed and the standard TCL communication channel is restored.

Next at process symbol 1720, a determination is made as to whether or not all work is completed and all work scripts have been communicated over the TCL communications channels. If the IC design program has completed its work on the IC design and there are no further work scripts to be sent over the TCL channels, the process may go to process symbol 1750 and end. However if not all of the work by the IC design program has been completed or there may be other work scripts that may be sent over the TCL channels, the process may loop back from process symbol 1720 to process symbol 1702 and wait for the next work script that is ready to be sent. That is, the process illustrated in FIG. 17 may be repeated over and over again for each TCL communication channel between the master process 900 and the slave processes 901A-901N.

IC Design Programs

Figure 8:
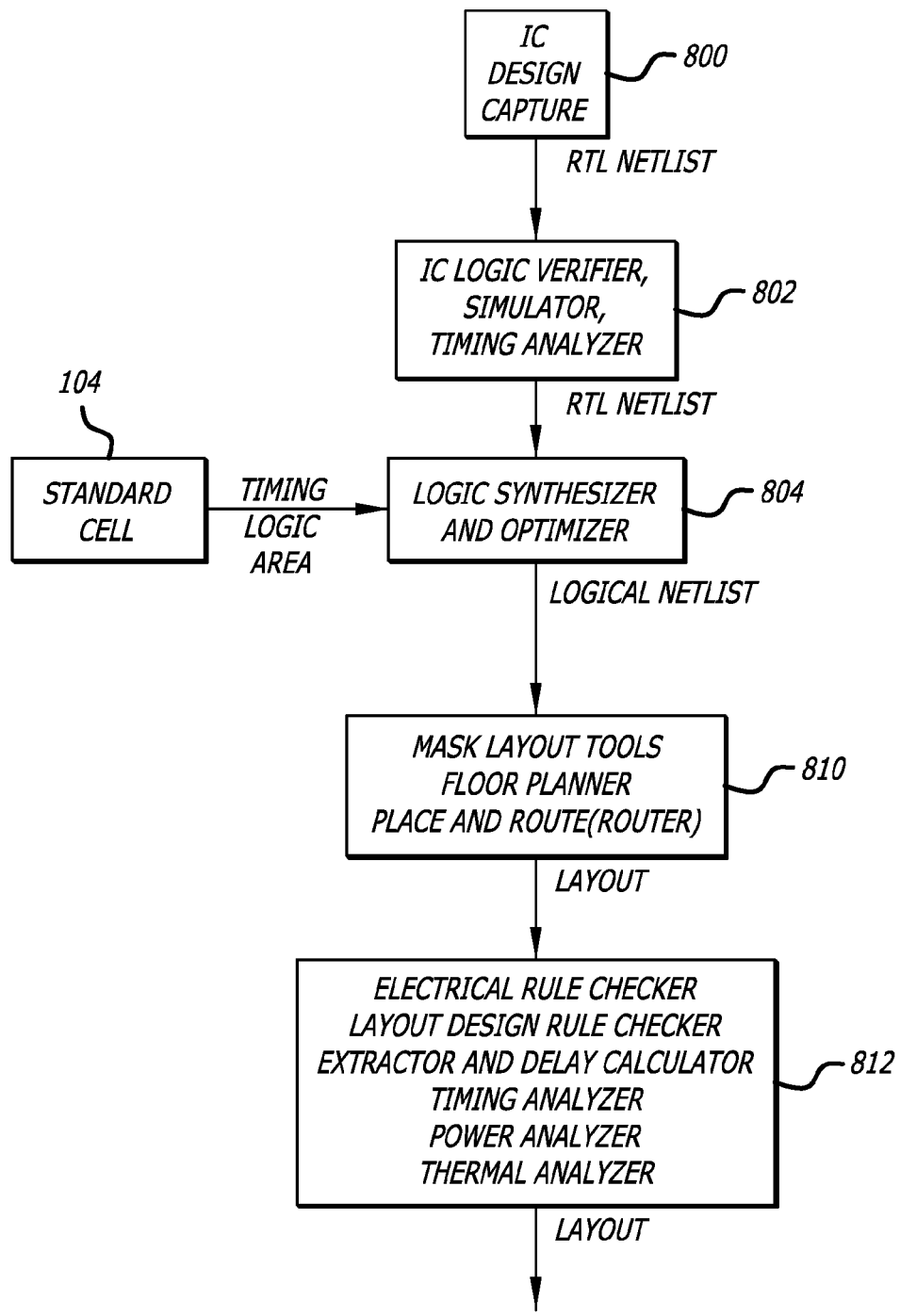
FIG. 8 is a flow chart of a typical IC design process and corresponding IC design tools that may incorporate a script generator and script dumper to use work scripts in the design of an IC and write out debug work script files in the case of a fault.

Referring now to FIG. 8, a flow chart of a typical IC design process and corresponding IC design tools or programs that may use work scripts, super-threading, debug logging, and write out debug work script files is illustrated. One or more of the IC design tools may incorporate a script generator and script dumper to use work scripts to perform work on an IC design and write out debug work script files in the case of a fault.

At process symbol 800, the system design of the integrated circuit is initially captured. The logical functionality may be captured by a logical description language such as through a high level description language (HDL) or verilog format that provides a register transfer level (RTL) netlist of the integrated circuit logic.

At process symbol 802, the RTL netlist is tested by an IC logic verifier, simulator, and/or timing analyzer to be sure the RTL netlist is sufficiently correct to go to the next step in the design flow.

At process symbol 804, the logical functionality may be further created during logic synthesis by a logic synthesizer and optimizer. The logical functionality may be represented by a logical description such as a logical netlist of gates and nets. The logical netlist may include a hierarchical gate listing of certain circuit cells of the standard cell library 104. The nets describe the interconnections between each of the circuit cells.

At process symbol 810, placement and routing of the circuit cells of the standard cell library 104 may be performed by a routing tool in response to the physical netlist to form graphical data representing mask layers of the semiconductor integrated circuit to form the circuits and the wire routes therebetween in an integrated circuit manufacturing facility (e.g., a wafer fab). Other layout type tools may be used to generate the layout including a floor planner to position functional blocks prior to automatic placement and routing by the router. Another layout tool is a mask layout tool that may be used to customize circuits and interconnections between gates and transistors during mask layout generation.

At process symbol 812 with the graphical data of the placement and routing, the parasitics of the wire routes may be extracted by an extractor and delays generated thereby may be calculated by a delay calculation tool or timing analyzer. Oftentimes the function of extraction and delay calculation are integrated into a single extractor and delay calculation program. Additionally, the mask layout can be verified to check for errors. An electrical rule check (ERC) program can be used to check for violations of electrical rules in the mask layout, such as a connection being made to the wrong power supply. A layout design rule check (DRC) program can be used to check for violations of manufacturing design rules in the mask layout, such as a metal spacing less than a minimum spacing rule or a metal line width less than a minimum line width. Additional analysis may be made with the mask layout such as a power analysis of power consumed in the IC design by a power analyzer and/or a thermal analysis of heat generated in the IC design by a thermal analyzer. The power analysis may lead to additional power and ground strapping in portions of the integrated circuit. The thermal analysis may lead to placing functional blocks in different positions to spread out the heat being generated in the integrated circuit to avoid overly hot spots and reduce thermal wear out of the transistors in the IC design.

When implemented in software, the elements of the embodiments of the invention are essentially the code segments to perform the necessary tasks. The program or code segments can be stored in a processor readable medium or transmitted by a computer data signal embodied in a carrier wave over a transmission medium or communication link. In a super-threading mode, the work scripts are commands that are sent over a TCL communication channel between a master process and one or more slave processes. The "processor readable medium" may include any medium that can store or transfer information. Examples of the processor readable medium include an electronic circuit, a semiconductor memory device, a read only memory (ROM), a flash memory, an erasable programmable read only memory (EPROM), a floppy diskette, a CD-ROM, an optical disk, a hard disk, a fiber optic medium, a radio frequency (RF) link, etc. The computer data signal may include any signal that can propagate over a transmission medium such as electronic network channels (LAN or WAN), optical fibers, air, electromagnetic, RF links, etc. The code segments may be downloaded via computer networks such as the Internet, Intranet, etc.

While certain exemplary embodiments have been described and shown in the accompanying drawings, it is to be understood that such embodiments are merely illustrative of and not restrictive on the broad invention, and that the embodiments of the invention not be limited to the specific constructions and arrangements shown and described, since various other modifications may occur to those ordinarily skilled in the art. Instead, the embodiments of the invention should be construed according to the claims that follow below.

What is claimed is:

1. A method comprising:
receiving a netlist of an integrated circuit design;
executing a first copy of an integrated circuit design program with a first processor associated with a first memory space to independently perform work on a first portion of the integrated circuit design; and
executing a second copy of the integrated circuit design program with a second processor associated with a second memory space to independently perform work on a second portion of the integrated circuit design;
wherein the second memory space is independent of the first memory space, and wherein the first memory space is not shared by both the first processor and the second processor, and wherein the second memory space is not shared by both the first processor and the second processor.

2. The method of claim 1, wherein
the first processor and the first memory space are in a first computer;
the second processor and the second memory space are in a second computer; and
the first computer and the second computer are coupled together by a computer network.

3. The method of claim 1, further comprising:
partitioning the netlist at least into the first portion and the second portion of the integrated circuit design to split up the work to be performed on the integrated circuit design.

4. The method of claim 1, wherein
the executing of the first copy of the integrated circuit design program is in response to a first pre-work script to independently perform work on the first portion of the integrated circuit design; and
the executing of the second copy of the integrated circuit design program is in response to a second pre-work script to independently perform work on the second portion of the integrated circuit design.

5. A method comprising:
receiving a netlist of an integrated circuit design;
executing a first copy of an integrated circuit design program with a first processor associated with a first memory space to independently perform work on a first portion of the integrated circuit design, wherein the executing of the first copy of the integrated circuit design program is in response to a first pre-work script to independently perform work on the first portion of the integrated circuit design;
executing a second copy of the integrated circuit design program with a second processor associated with a second memory space to independently perform work on a second portion of the integrated circuit design, wherein the executing of the second copy of the integrated circuit design program is in response to a second pre-work script to independently perform work on the second portion of the integrated circuit design and the second memory space is independent of the first memory space;
executing a third copy of the integrated circuit design program with a third processor associated with a third memory space, wherein the third memory space is independent of the first memory space and the second memory space;
forming a first communication channel between the third processor and the first processor to communicate the first pre-work script; and
forming a second communication channel between the third processor and the second processor to communicate the second pre-work script.

6. A system comprising:
a first computer system including at least a first processor configured to independently execute a first process associated with a first copy of an integrated circuit design program in a first memory space;
a second computer system including at least a second processor configured to independently execute a second process associated with a second copy of the integrated circuit design program in a second memory space; and
a computer network to couple the first computer system and the second computer system together;
wherein work on an integrated circuit design is to be divided up and spread across the computer network to be independently performed by available processors amongst the first computer system and the second computer system, and wherein the first memory space is not shared by both the first processor and the second processor, and wherein the second memory space is not shared by both the first processor and the second processor.

7. The system of claim 6, wherein
the first computer system further includes a first memory to independently execute the first process; and
the second computer system further includes a second memory independent of the first memory to independently execute the second process.

8. The system of claim 6, wherein
the first process is a master process to send one or more work scripts over the computer network to the second computer system to divide and spread the work on the integrated circuit design across the computer network to available processors.

9. The system of claim 6, further comprising:
a shared storage to store one or more libraries and allow access thereto by the first computer system and the second computer system to independently perform work on the integrated circuit design.

* * * * *